US006847551B2

(12) United States Patent
Owen

(10) Patent No.: US 6,847,551 B2
(45) Date of Patent: Jan. 25, 2005

(54) APPARATUS FOR FEEDBACK USING A TUNNEL DEVICE

(75) Inventor: William H. Owen, Los Altos Hills, CA (US)

(73) Assignee: Xicor, Inc., Milpitas, CA (US)

( * ) Notice: Subject to any disclaimer, the term of this patent is extended or adjusted under 35 U.S.C. 154(b) by 0 days.

(21) Appl. No.: 10/353,403

(22) Filed: Jan. 28, 2003

(65) Prior Publication Data

US 2004/0145949 A1 Jul. 29, 2004

(51) Int. Cl.[7] .............................................. G11C 16/04
(52) U.S. Cl. ........................... 365/185.05; 365/189.07; 365/189.09; 365/207
(58) Field of Search ....................... 365/185.05, 189.07, 365/189.09, 207

(56) References Cited

U.S. PATENT DOCUMENTS

| | | | |
|---|---|---|---|
| 4,935,702 A | 6/1990 | Mead et al. | 330/9 |
| 4,953,928 A | 9/1990 | Anderson et al. | 357/23.5 |
| 4,980,859 A | 12/1990 | Guterman et al. | 365/154 |
| 5,059,920 A | 10/1991 | Anderson et al. | 330/253 |
| 5,095,284 A | 3/1992 | Mead | 330/253 |
| 5,166,562 A | 11/1992 | Allen et al. | 307/571 |
| 5,875,126 A | 2/1999 | Minch et al. | 365/185.01 |
| 5,903,487 A * | 5/1999 | Wu et al. | 365/45 |
| 5,986,927 A | 11/1999 | Minch et al. | 365/185.1 |
| 6,297,689 B1 | 10/2001 | Merrill | 327/540 |
| 6,515,903 B1 * | 2/2003 | Le et al. | 365/185.18 |

OTHER PUBLICATIONS

Fowler, et al., "Electron Emission in Intense Electric Fields", Royal Soc. Proc.,A, vol. 119 (1928).
Lenzlinger, et al., "Fowler–Nordheim Tunneling Into Thermally Grown $SiO_2$", Applied Physics, Vo. 40, No. 1 (Jan. 1969).
Carley, "Trimming Analog Circuits Using Floating–Gate Analog MOS Memory", IEEE Journal of Solid–State Circuits, vol. 24, No. 6 (Dec. 1989).
Hasler, et al. "Adaptive Circuits Using pFET Floating–Gate Devices", pp. 1–15 (undated).
Figueroa, et al., "A Floating–Gate Trimmable High Resolution DAC in Standard 0.25μm CMOS", Nonvolatile Semiconductor Memory Workshop, pp. 46–47 (Aug. 2001).

* cited by examiner

*Primary Examiner*—Son T. Dinh
(74) *Attorney, Agent, or Firm*—Coudert Brothers LLP

(57) ABSTRACT

An apparatus for using feedback to set a floating gate to a desired voltage during a set mode is disclosed. The apparatus includes a floating gate, a first and second tunnel device formed respectively between the floating gate and a first and second electrode, a first circuit coupled to the floating gate for comparing the voltage on the floating gate to a third voltage and for generating an output voltage at an output terminal, and a feedback circuit coupled between the output terminal and the floating gate. The feedback circuit includes the first tunnel device and a third tunnel device for causing the floating gate voltage to be modified as a function the output voltage until the floating gate voltage, the third voltage and the output voltage are approximately equal.

8 Claims, 12 Drawing Sheets

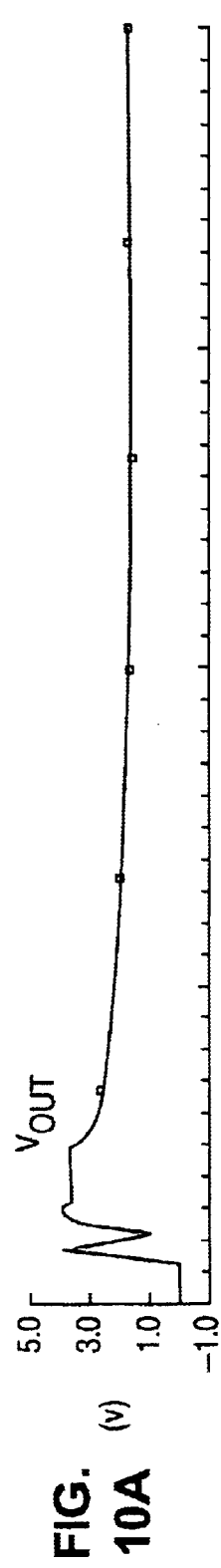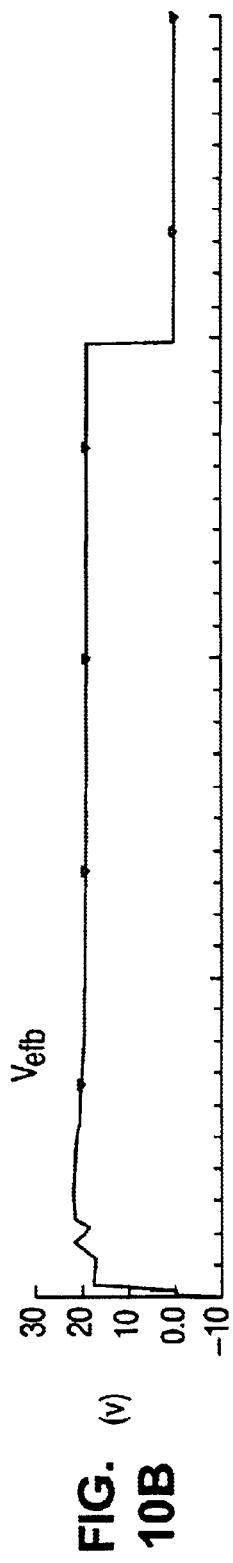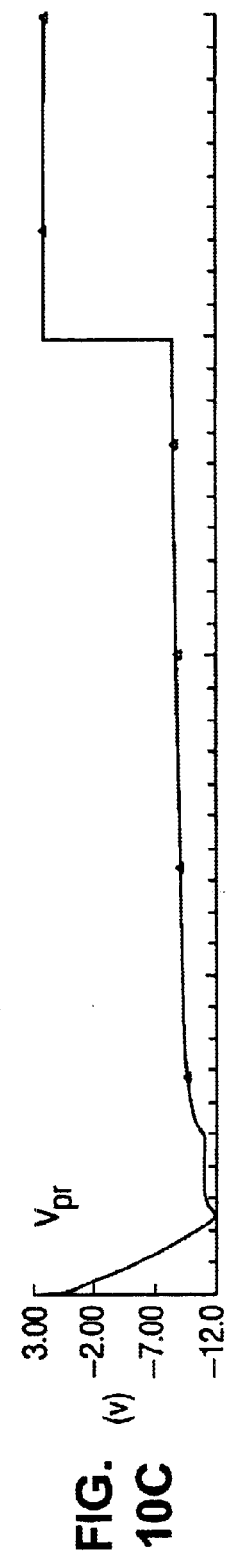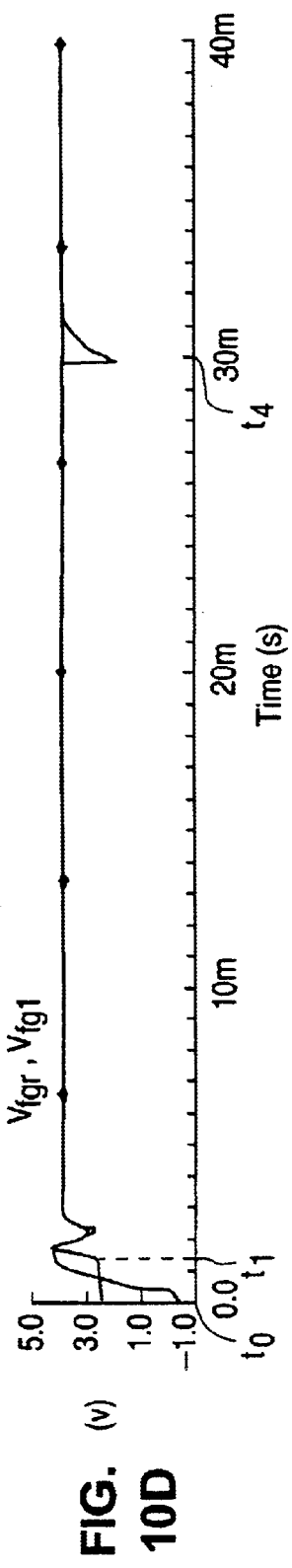
FIG. 10A
FIG. 10B
FIG. 10C
FIG. 10D

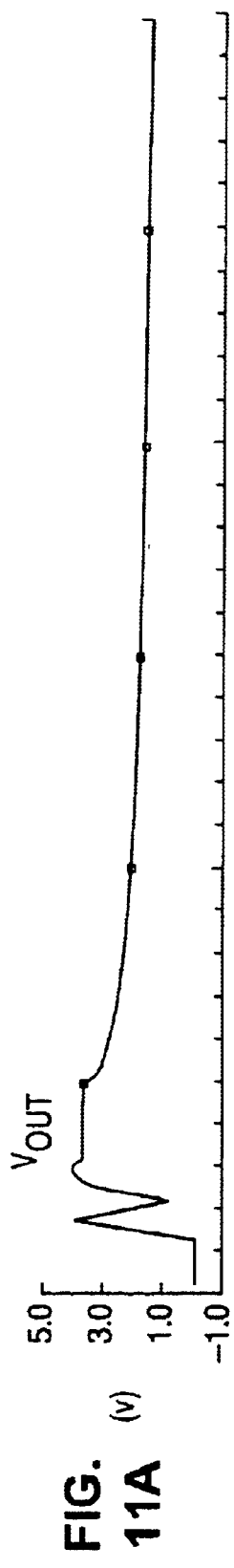
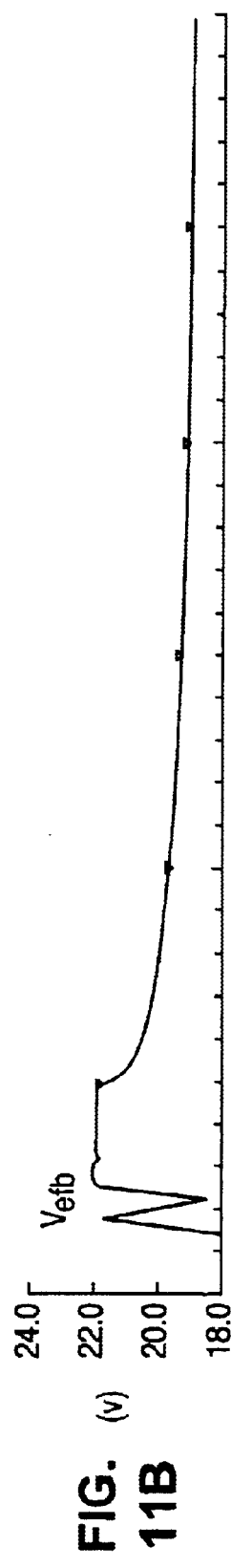
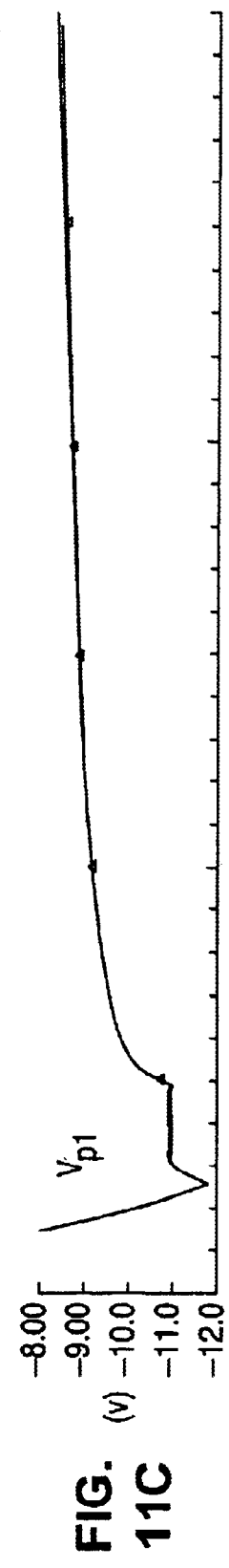
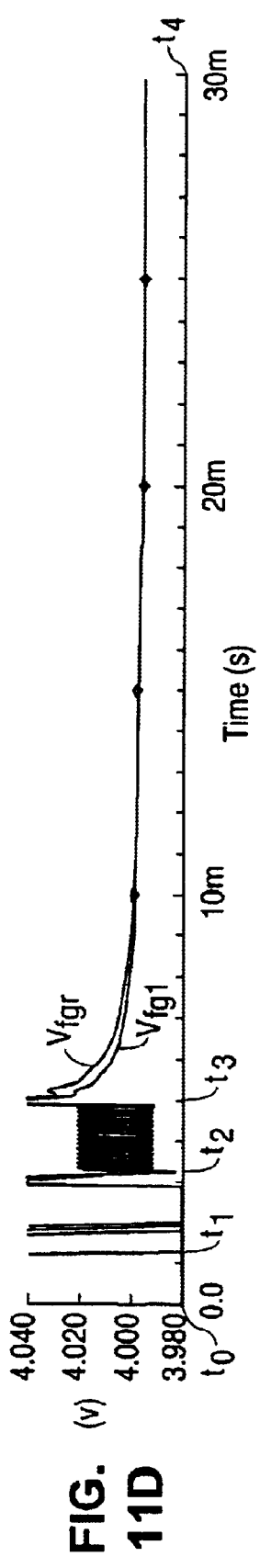
FIG. 11A
FIG. 11B
FIG. 11C
FIG. 11D

APPARATUS FOR FEEDBACK USING A TUNNEL DEVICE

FIELD OF THE INVENTION

This invention relates to a floating gate circuit, and more specifically to an apparatus for feedback using a tunnel device to precisely set a floating gate to a desired voltage during a set mode.

BACKGROUND OF THE INVENTION

Programmable analog floating gate circuits have been used since the early 1980's in applications that only require moderate absolute voltage accuracy over time, e.g., an absolute voltage accuracy of 100–200 mV over time. Such devices are conventionally used to provide long-term nonvolatile storage of charge on a floating gate. A floating gate is an island of conductive material that is electrically isolated from a substrate but capacitively coupled to the substrate or to other conductive layers. Typically, a floating gate forms the gate of an MOS transistor that is used to read the level of charge on the floating gate without causing any leakage of charge therefrom.

Various means are known in the art for introducing charge onto a floating gate and for removing the charge from the floating gate. Once the floating gate has been programmed at a particular charge level, it remains at that level essentially permanently, because the floating gate is surrounded by an insulating material which acts as a barrier to discharging of the floating gate. Charge is typically coupled to the floating gate using hot electron injection or electron tunneling. Charge is typically removed from the floating gate by exposure to radiation (UV light, x-rays), avalanched injection, or Fowler-Nordheim electron tunneling. The use of electrons emitted from a cold conductor was first described in an article entitled *Electron Emission in Intense Electric Fields* by R. H. Fowler and Dr. L. Nordheim, Royal Soc. Proc., A, Vol. 119 (1928). Use of this phenomenon in electron tunneling through an oxide layer is described in an article entitled *Fowler-Nordheim Tunneling into Thermally Grown $SiO_2$* by M. Lenzlinger and E. H. Snow, Journal of Applied Physics, Vol. 40, No. 1 (January, 1969), both of which are incorporated herein by reference. Such analog floating gate circuits have been used, for instance, in digital nonvolatile memory devices and in analog nonvolatile circuits including voltage reference, Vcc sense, and power-on reset circuits.

FIG. 1A is a schematic diagram that illustrates one embodiment of an analog nonvolatile floating gate circuit implemented using two polysilicon layers formed on a substrate and two electron tunneling regions. FIG. 1A illustrates a cross-sectional view of an exemplary prior art programmable voltage reference circuit 70 formed on a substrate 71. Reference circuit 70 comprises a Program electrode formed from a first polysilicon layer (poly1), an Erase electrode formed from a second polysilicon layer (poly2), and an electrically isolated floating gate comprised of a poly1 layer and a poly2 layer connected together at a corner contact 76. Typically, polysilicon layers 1 and 2 are separated from each other by a thick oxide dielectric, with the floating gate fg being completely surrounded by dielectric. The floating gate fg is also the gate of an NMOS transistor TØ shown at 73, with a drain D and a source S that are heavily doped n+ regions in substrate 70, which is P type. (The number zero is also referred to as "0" or Ø herein.) The portion of dielectric between the poly1 Program electrode and the floating gate fg, as shown at 74, is a program tunnel region (or "tunnel device") TP, and the portion of dielectric between the poly1 floating gate fg and the poly2 erase electrode, shown at 75, is an erase tunnel region TE. Both tunnel regions have a given capacitance. Since these tunnel regions 74,75 are typically formed in thick oxide dielectric, they are generally referred to as "thick oxide tunneling devices" or "enhanced emission tunneling devices." Such thick oxide tunneling devices enable the floating gate to retain accurate analog voltages in the +/−4 volt range for many years. This relatively high analog voltage retention is made possible by the fact that the electric field in most of the thick dielectric in tunnel regions 74,75 remains very low, even when several volts are applied across the tunnel device. This low field and thick oxide provides a high barrier to charge loss until the field is high enough to cause Fowler-Nordheim tunneling to occur. Finally, reference circuit 70 includes a steering capacitor CC that is the capacitance between floating gate fg and a different n+ region formed in the substrate that is connected to a Cap electrode.

FIG. 1B is a schematic diagram that illustrates a second embodiment of a floating gate circuit 70 that is implemented using three polysilicon layers. The three polysilicon floating gate circuit 70' is similar to the two polysilicon embodiment except that, for example Erase electrode is formed from a third polysilicon layer (poly 3). In addition, the floating gate fg is formed entirely from a poly2 layer. Thus, in this embodiment there is no need for a corner contact to be formed between the poly1 layer portion and the poly2 layer portion of floating gate fg, which is required for the two polysilicon layer cell shown in FIG. 1A.

Referring to FIG. 2, shown at 25 is an equivalent circuit diagram for the voltage reference circuit 70 of FIG. 1A and 70' of FIG. 1B. For simplicity, each circuit element of FIG. 2 is identically labeled with its corresponding element in FIGS. 1A and 1B.

Setting reference circuit 70 to a specific voltage level is accomplished using two separate operations. Referring again to FIG. 1A, the floating gate fg is first programmed or "reset" to an off condition. The floating gate fg is then erased or "set" to a specific voltage level. Floating gate fg is reset by programming it to a net negative voltage, which turns off transistor TØ. This programming is done by holding the Program electrode low and ramping the n+bottom plate of the relatively large steering capacitor CC to 15 to 20V via the Cap electrode. Steering capacitor CC couples the floating gate fg high, which causes electrons to tunnel through the thick oxide at 74 from the poly1 Program electrode to the floating gate fg. This results in a net negative charge on floating gate fg. When the bottom plate of steering capacitor CC is returned to ground, this couples floating gate fg negative, i.e., below ground, which turns off the NMOS transistor TØ.

To set reference circuit 70 to a specific voltage level, the n+ bottom plate of steering capacitor CC, the Cap electrode, is held at ground while the Erase electrode is ramped to a high voltage, i.e., 12 to 20V. Tunneling of electrons from floating gate fg to the poly2 Erase electrode through the thick oxide at 75 begins when the voltage across tunnel device TE reaches a certain voltage, which is typically approximately 11V. This tunneling of electrons from the fg through tunnel device TE increases the voltage of floating gate fg. The voltage on floating gate fg then "follows" the voltage ramp coupled to the poly2 Erase electrode, but at a voltage level offset by about 11V below the voltage on the Erase electrode. When the voltage on floating gate fg reaches the desired set level, the voltage ramp on poly2

Erase electrode is stopped and then pulled back down to ground. This leaves the voltage on floating gate fg set at approximately the desired voltage level.

As indicated above, reference circuit 70 meets the requirements for voltage reference applications where approximately 200 mV accuracy is sufficient. The accuracy of circuit 70 is limited for two reasons. First, the potential on floating gate fg shifts down about 100 mV to 200 mV after it is set due to the capacitance of erase tunnel device TE which couples floating gate fg down when the poly2 Erase electrode is pulled down from a high voltage to ØV. The amount of this change depends on the ratio of the capacitance of erase tunnel device TE to the rest of the capacitance of floating gate fg (mostly due to steering capacitor CC), as well as the magnitude of the change in voltage on the poly2 Erase electrode. This voltage "offset" is well defined and predictable, but always occurs in such prior art voltage reference circuits because the capacitance of erase tunnel device TE cannot be zero. Second, the accuracy of circuit 70 is also limited because the potential of floating gate fg changes another 100 mV to 200 mV over time after it is set due to various factors, including detrapping of the tunnel devices and dielectric relaxation of all the floating gate fg capacitors.

An analog voltage reference storage device that uses a floating gate is described in U.S. Pat. No. 5,166,562 and teaches the uses of hot electron injection for injecting electrons onto the floating gate and electron tunneling for removing electrons from the floating gate. The floating gate is programmed by controlling the current of the hot electron injected electrons after an erase step has set the floating gate to an initial voltage. See also U.S. Pat. No. 4,953,928. Although this method of programming the charge on a floating gate is more accurate than earlier analog voltage reference circuits including a floating gate, the level of accuracy is still on the order of 50 mV to 200 mV.

Prior art floating gate storage devices have sometimes used dual conduction of Fowler-Nordheim tunnel devices, i.e., wherein both the program and erase tunnel elements in a floating gate device are caused to conduct simultaneously in order to provide the coupling of charge onto the floating gate. However, this method has only been used in digital circuits to program the floating gate to either a "1" condition or a "0" condition to provide memory storage. The precise charge on the floating gate in such applications is not of concern and so is not precisely controlled in such circuits. According to the prior art, such dual conduction digital programming of a floating gate is considered to be a less efficient and desirable way than generating electron conduction through a single tunnel element to control the level of charge on a floating gate. Known disadvantages of dual conduction digital programming of a floating gate include the fact that a larger total voltage is required to provide dual conduction and tunnel oxide trap-up is faster because more tunnel current is required.

An example of a prior art analog nonvolatile floating gate circuit that uses dual conduction of electrons for adding and removing electrons from a floating gate is disclosed in U.S. Pat. No. 5,059,920, wherein the floating gate provides an adaptable offset voltage input for a CMOS amplifier. In this device, however, only one Fowler-Nordheim tunnel device is used. The electrons are injected onto the floating gate using hot electron injection, while Fowler-Nordheim electron tunneling is used to remove electrons from the floating gate, so as to accurately control the charge on the floating gate. This means of injecting electrons onto the floating gate is used because the charge transfer is a controlled function of the voltage on the floating gate. Another example of a prior art dual conduction floating gate circuit is disclosed in U.S. Pat. No. 5,986,927. A key problem with such prior art devices is that they do not compensate for common-mode voltage and current offsets, common-mode temperature effects, and mechanical and thermal stress effects in the integrated circuit.

Applications that require increased absolute voltage accuracy generally use a bandgap voltage reference. A bandgap voltage reference typically provides approximately 25 mV absolute accuracy over time and temperature, but can be configured to provide increased accuracy by laser trimming or $E^2$ digital trimming at test. While a bandgap voltage reference provides greater accuracy and increased stability over the prior art voltage reference circuits discussed above, a bandgap voltage reference only provides a fixed voltage of about 1.2V. Therefore, additional circuitry, such as an amplifier with fixed gain, is needed to provide other reference voltage levels. Moreover, prior art bandgap voltage references typically draw a relatively significant current, i.e., greater than 10 $\mu$A.

What is needed is an improved apparatus for setting a floating gate in a floating gate circuit to a desired voltage such that a reference voltage can be provided that has an improved stability and accuracy over time and temperature as compared to prior art voltage references.

SUMMARY OF THE INVENTION

The present invention is directed at addressing the above-mentioned shortcomings, disadvantages, and problems of the prior art. The present invention is an apparatus for using feedback to set a floating gate to a desired voltage during a set mode, said apparatus comprising: a) a floating gate for storing charge thereon; b) a first tunnel device formed between said floating gate and a first tunnel electrode, said first tunnel electrode biased by a first voltage; c) a second tunnel device formed between said floating gate and a second tunnel electrode, said second tunnel electrode biased by a second voltage, wherein the voltage differential between said first and second voltages for causing said first and second tunnel devices to operate in dual conduction during said set mode; d) a first circuit coupled to said floating gate, said first circuit comprising a differential stage for comparing the voltage on said floating gate to a third voltage, and again stage for generating an output voltage at an output terminal that is a function of the difference between the voltage on said floating gate and said third voltage; and e) a feedback circuit coupled between said output terminal and said floating gate comprising said first tunnel device and a third tunnel device that is preferably reasonably well matched by chip layout to said first tunnel device, said feedback circuit for causing the voltage on said floating gate to be modified as a function said output voltage until said floating gate voltage, said third voltage and said output voltage are approximately equal.

An object of the present invention is to provide an apparatus for feedback during a set mode to set a desired voltage on a floating gate such that a reference voltage is generated that has an improved accuracy and stability over prior art voltage references.

A key advantage of the present invention is that a floating gate voltage reference circuit programmed using the present invention has an improved accuracy over prior art floating gate voltage references by more than a factor of 100.

BRIEF DESCRIPTION OF THE DRAWINGS

The forgoing aspects and attendant advantages of the present invention will become more readily appreciated by reference to the following detailed description, when taken in conjunction with the accompanying drawings, wherein:

FIGS. 10A–10D illustrate various voltage waveforms vs. time for a specific implementation of the method of FIG. 9;

FIGS. 11A–11D illustrate various voltage waveforms vs. time for a specific implementation of the method of FIG. 9.

DETAILED DESCRIPTION OF THE INVENTION

Figure 1A:
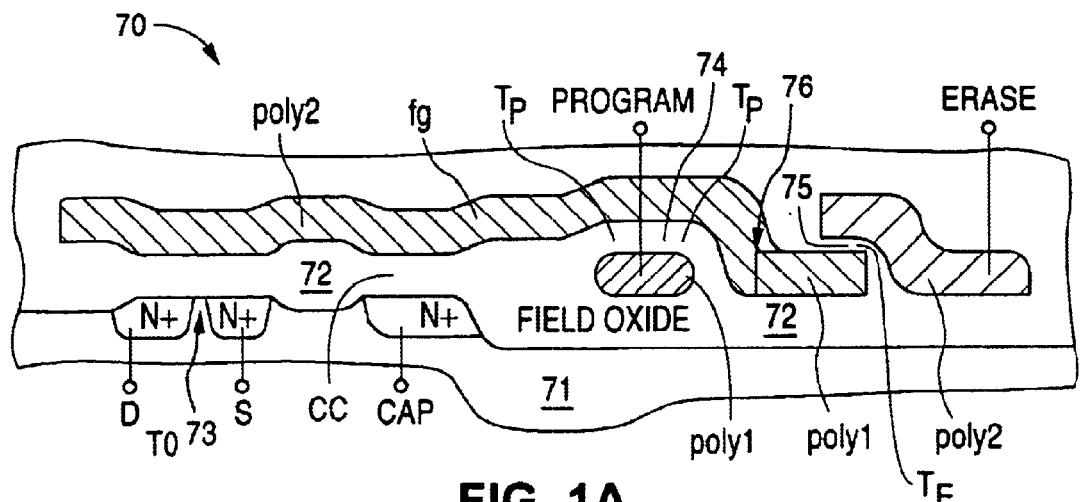
FIG. 1A is a schematic diagram that illustrates a cross-sectional view of a prior art programmable floating gate circuit formed from two polysilicon layers.
Figure 1B:
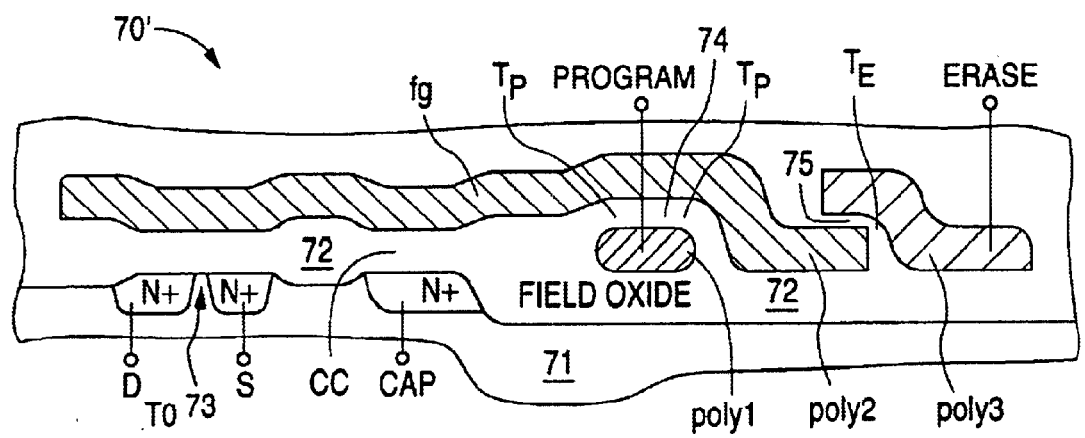
FIG. 1B is a similar prior art floating gate circuit formed from three polysilicon layers.
Figure 2:
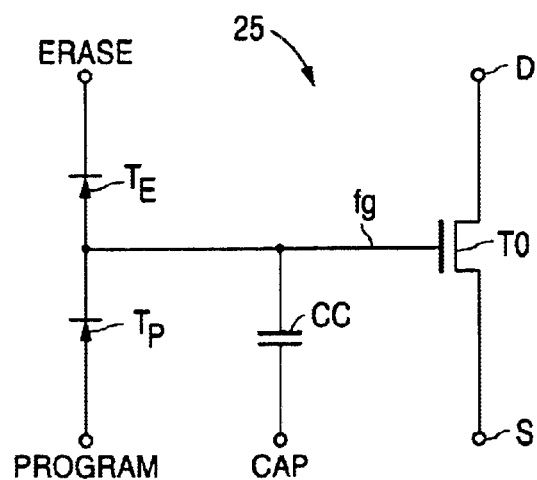
FIG. 2 is an equivalent circuit diagram for the reference circuit illustrated in FIGS. 1A and 1B.
Figure 3:
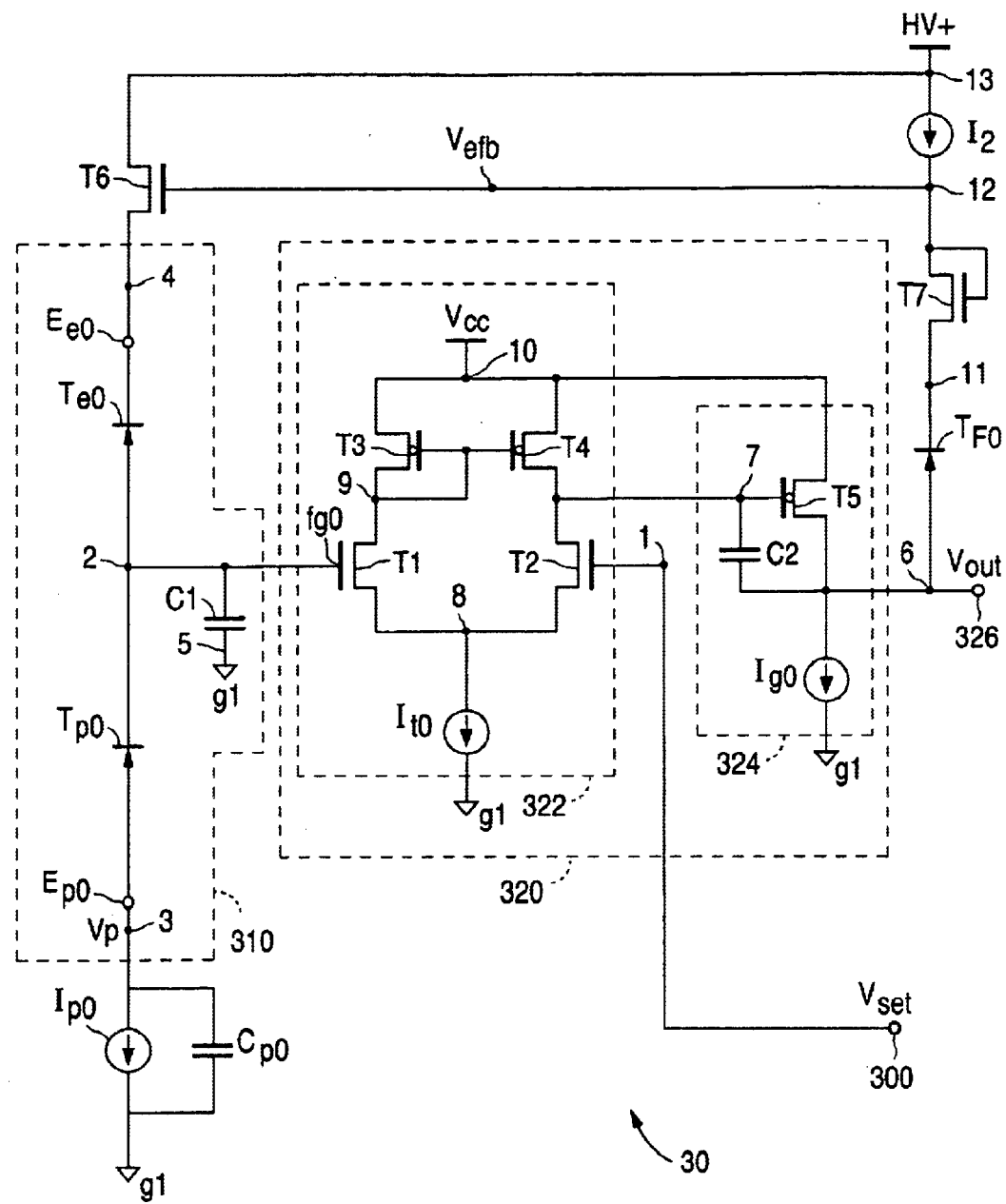
FIG. 3 is a circuit diagram of a differential single floating gate circuit, which is one embodiment of a high precision circuit for programming a floating gate.
Figure 4A:
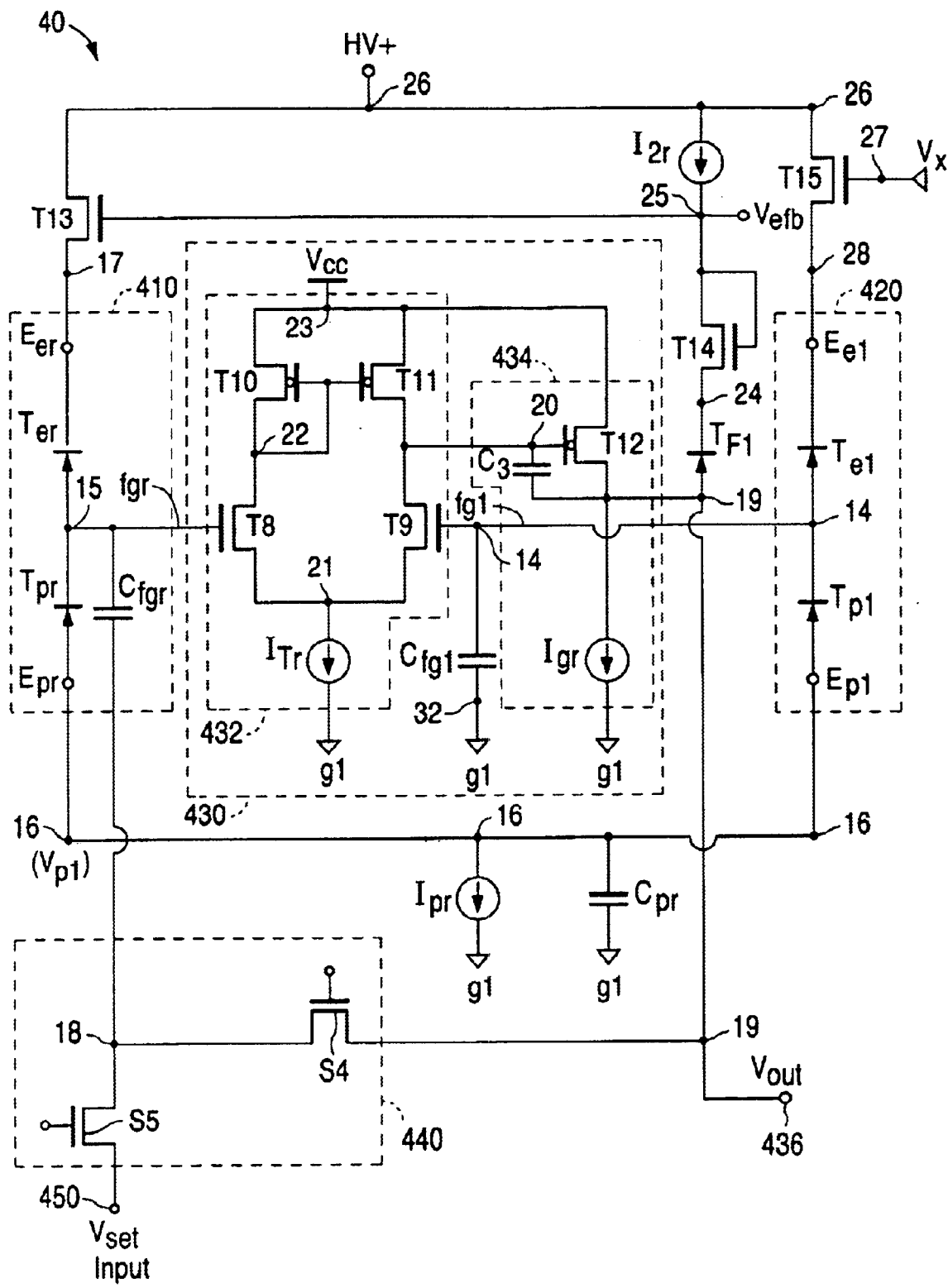
FIG. 4A is a circuit diagram of a differential dual floating gate circuit, which is another embodiment of a high precision circuit for programming a floating gate.

The present invention is an apparatus for providing feedback from the output of a floating gate circuit to a floating gate within the floating gate circuit for setting the floating gate to a desired voltage during a set mode. FIG. 3 is a circuit diagram of a differential single floating gate circuit 30 according to the present invention for accurately setting a floating gate to an analog voltage during a high voltage set mode or set cycle. FIG. 4A is a circuit diagram of a differential dual floating gate circuit 40 according to another embodiment of the present invention. Circuit 40 is also used to accurately set a floating gate to an analog voltage during a high voltage set mode. Once the analog voltage level is set, both circuit 30 and circuit 40 can then be configured during a read mode as a precise voltage comparator circuit with a built-in voltage reference or a precise voltage reference circuit. Circuit 30 and circuit 40 are preferably implemented as an integrated circuit manufactured using industry standard CMOS processing techniques. Since the sequence used during the set mode is similar for both circuits, circuit 30 and the method for programming a floating gate using circuit 30 will be described first.

Circuit 30 comprises a floating gate fgØ at a node 2 that, at the conclusion of a set mode, is set to a voltage that is a function of, and preferably is equal to an input set voltage VsetØ received at an input terminal 300 coupled to a node 1. This set mode may be instituted at the factory to cause floating gate fgØ to be set to a desired voltage. Alternatively, a later user of circuit 30 can cause circuit 30 to enter a set mode wherever the user wishes to update the voltage on fgØ as a function of the VsetØ voltage input by the user during this later, or in the field, set mode operation. Circuit 30 further comprises a circuit 310 that includes: a programming tunnel device TPØ formed between floating gate fgØ and a programming electrode EpØ, at a node 3; an erase tunnel device TeØ formed between floating gate fgØ and an erase electrode EeØ, at a node 4; and a steering capacitor C1 coupled between floating gate fgØ and a node 5.

Preferably, programming electrode EpØ receives a negative voltage during the set mode, and erase electrode EeØ receives a positive voltage during the set mode. Moreover, TpØ and TeØ are Fowler-Nordheim tunnel devices that are reasonably well matched by layout. The bottom plate of steering capacitor C1 is coupled to a predetermined voltage during the set mode that is preferably ground g1. Steering capacitor C1 is used to provide a stable ground reference for floating gate fgØ.

Setting fgØ to a specific charge level during the set mode, which corresponds to a specific voltage at node 2, is achieved by taking EpØ negative and EeØ positive, such that the voltage at node 4 minus the voltage at node 3 is two tunnel voltages or approximately 22V. An alternative is to take EpØ negative and EeØ positive such that approximately 5 nA of current flows from node 4 to node 3. In either case, both tunnel devices are conducting, i.e., the tunnel devices are in "dual conduction." By operating in dual conduction, the voltage on the floating gate fgØ can stabilize at a DC voltage level for as long a time as needed for Circuit 30 to settle to a very precise and accurate level. Operating two Fowler-Nordham tunneling devices in dual conduction is key to making it possible to set the floating gate fgØ voltage very accurately using either on-chip circuitry or test equipment off-chip.

In dual conduction, the tunnel devices, TeØ and TpØ, which are reasonably well matched as a result of their chip layout, will modify the charge level on the floating gate fgØ by allowing electrons to tunnel onto and off of floating gate fgØ so as to divide the voltage between nodes 4 and 3 in half. Thus, the floating gate voltage, i.e., the voltage at node 2, will be VfgØ=Vnode3+(Vnode3−Vnode3)/2, which is half way between the voltage at node 4 and the voltage at node 3. Under these conditions, the dual conduction current can typically charge or discharge node 2, which typically has less than 5 pF capacitance, in less than 1 mSec. As this occurs, the floating gate voltage "tracks" directly with the voltage at nodes 3 and 4 and settles to a DC voltage that is half way between those two voltages in a few mSec. Accordingly, VfgØ can be set to a positive or a negative voltage or zero volts depending upon the voltages at electrodes EeØ and EpØ. For example, if the tunnel voltage is approximately 11V for the erase and program tunnel devices TeØ and TpØ, and the voltage at electrode EeØ is set to about +16V and the voltage at electrode EpØ is about −6V, then VfgØ will settle at about +5V, which is the midpoint between the two voltages. If the voltage at electrode EeØ is set to about +11V and the voltage at electrode EpØ is about −11V, then VfgØ will go to about ØV. If the voltage at electrode EeØ is set to about +6V and the voltage at electrode EpØ is about −16V, then VfgØ will go to about −5V.

Note that, in a preferred embodiment, a specific voltage is not generated at node 3 during the set mode. The voltage used to control the charge level on floating gate fgØ is the voltage at node 4. A current source IpØ, which is preferably implemented as a charge pump, provides the necessary voltage compliance to generate a negative voltage sufficient to generate the voltage difference required to produce dual conduction tunneling in tunnel devices TeØ and TpØ.

Circuit 30 further includes a circuit 320 that compares VfgØ, the voltage on the floating gate fgØ, with the voltage at node 1 and generates an output voltage Vout, at a node 6, that is a function of the difference between VsetØ and the voltage at node 1. Circuit 320 preferably includes a differential amplifier (or differential stage) 322 that is preferably configured to have an inverting input coupled to floating gate fgØ, a non-inverting input coupled to node 1, and an output at a node 7. Circuit 320 preferably further includes a gain stage 324 with an input coupled to node 7 and an output terminal 326, at node 6. The differential stage compares the voltages received at its inputs and amplifies that difference, typically by a factor of 50 to 100. The gain stage then further amplifies that difference by another factor of 50 to 100. Moreover at the conclusion of the set mode, circuit 320 ideally settles to a steady state condition such that VfgØ= VsetØ.

Referring again to FIG. 3, the differential stage 322 preferably includes enhancement mode transistors T1, T2, T3 and T4. Transistors T1 and T2 are preferably NMOS transistors that are reasonably well matched by layout, and transistors T3 and T4 are preferably PMOS transistors that are reasonably well matched by layout. The sources of NMOS transistors T1 and T2 are coupled together at a node 8. The drain of NMOS transistor T1 is coupled to a node 9, and its gate is floating gate fgØ. The drain of NMOS transistor T2 is coupled to node 7, and its gate is coupled to node 1. PMOS transistor T3 is coupled common drain, common gate, to node 9, with its source coupled to node 10. The gate of PMOS transistor T4 is coupled to node 9. Its drain is coupled to node 7, and its source is coupled to node 10. A voltage supply Vcc, typically 3 to 5 volts, is coupled to node 10, and a current source ItØ is coupled between node 8 and ground g1 to cause transistors T1, T2, T3 and T4 to operate in either the prethreshold or linear region during the set mode. Current source ItØ can be implemented using any number of conventional circuits.

One benefit provided by differential stage 322 is that temperature and stress effects track in transistors T1–T4 because the temperature coefficient Tc of these transistors is approximately the same. That is, any variation in the temperature of the integrated circuit chip on which a floating gate circuit according to the present invention is implemented will have the same effect on transistors T1–T4, such that differential stage 322 is in a balanced condition essentially independent of temperature. Similarly, mechanical and thermal stress effects are also common-mode and so their effects are also greatly reduced.

The gain stage 324 preferably includes a PMOS pull-up transistor T5 biased by Vcc, and includes a current source pull-down load IgØ. The source of transistor T5 is coupled to node 10. Its gate is coupled to the differential stage PMOS pull-up T4 at node 7, and its drain is coupled to node 6. Current source pull-down load IgØ is coupled between node 6 and ground g1. The gain stage 324 also preferably includes a compensation capacitor C2 coupled between nodes 6 and 7. Current source pull-down load IgØ is preferably an active load using an NMOS current mirror or a depletion device. Using an active current source with relatively high output resistance, the gain stage 324 can provide a voltage gain of about 100. The output swing of the gain stage 324 is nearly full rail from ground to Vcc. Stability and response of this circuit can be easily adjusted for various processes using compensation capacitor C2. In this configuration, transistor T5 provides good current sourcing capacity, but current sinking is limited to the current in the current source pull-down IgØ. Therefore, the current in IgØ should be greater than the pull-up current required by the load on Vout so that the gain stage 324 is capable of adequately controlling Vout, at node 6, by sinking all of the current that flows to node 6.

Circuit 320 further operates in the following manner during the set mode. When biased by Vcc and current source ItØ, T1 senses VfgØ relative to input set voltage VsetØ (300), which is sensed by transistor T2, and the amplified difference appears as Vout at node 6. If VfgØ is initially less than VsetØ, T2 is turned on more than T1, and the current flow through T2 (and through T4 since they are connected in series) is initially greater than the current flow through T1 (and correspondingly T3). The gate of the pull up transistor T3 is tied to the drain of 13 and also to the gate of pullup transistor T4, which makes the current in T4 a mirror of the current in T3. When more current flows through T4 than T3, the voltage, V7, on node 7 drops below the voltage, V9, on node 9. The lower voltage on node 7 causes the current through T5 to increase which pulls Vout high. The voltage gain of the differential stage 322 is typically about 80 and the voltage gain of the output stage 324 is about 100, giving an overall gain from VsetØ to Vout of about 8000. A negative feedback path or loop from Vout to the inverting input fgØ is necessary for the differential circuit 320 to settle at the point where the voltage on fgØ is equal to VsetØ. During the set mode, this feedback path is provided by tunnel devices TFØ, TeØ and transistors T6 and T7, as described in the next section. When Vout goes high, the negative feedback path pulls VfgØ higher. As VfgØ rises, the current in T1 increases until it matches the current in T2. At this point, the differential circuit 320 settles to a steady state condition where the currents in transistors T1, T2, T3, and T4 match, and VfgØ =VsetØ.

Those skilled in the art will realize that circuit 320 can be implemented using PMOS transistors for T1 and T2 and NMOS transistors for T3 and T4. For this implementation, the gain stage 324 comprises an NMOS pull-down transistor T5 coupled to a current source pull-up load IgØ.

Circuit 30 also includes a feedback loop coupled between nodes 6 and 2. During the set mode, this feedback loop causes the voltage differential between tunnel electrodes EeØ and EpØ to be modified by modifying the voltage at node 4 as a function of the output voltage at node 6. The feedback loop preferably comprises a level shift circuit that is preferably a tunnel device TFØ formed between node 6 and a node 11 and a transistor T7, preferably an NMOS transistor, coupled common gate, common drain to a node 12, with its source coupled to node 11. Also included in the feedback loop is a transistor T6, preferably an NMOS transistor, having its gate coupled to node 12, its source coupled to node 4, and thereby to erase tunnel device TeØ, and its drain coupled to a node 13.

As earlier indicated, the maximum output of the gain stage is approximately Vcc. However, this is not high enough to drive Vefb at node 12 directly, because Vefb typically needs to go to about 14 to 19 volts, which is well above the usual 3 to 5 volt Vcc supply level. The level shift circuit TFØ and T7 shifts the relatively low output voltage at node 6 (Vout) up to the desired 14 to 19 volt range. Preferably, TFØ and TeØ are reasonably well matched by layout and transistors T6 and T7 are reasonably well matched by layout. Under these conditions, when the same tunnel current flows through both TFØ and TeØ, the level shift tracks the erase tunnel voltage as measured by the voltage drop from node 4 to node 2, which drives the gate of transistor T1 (fgØ) to the same voltage as the voltage on the gate of transistor T2 (VsetØ) when circuit 320 settles. This adds to the improved setting accuracy of the circuit.

One advantage of having the level shift track the erase tunnel voltage is that, as the voltage necessary to create tunneling changes, due to charge trapping in the dielectric as more and more set cycles are performed, output voltage Vout continues to follow the input set voltage VsetØ and operate in the same voltage range. Another advantage is that when the output voltage Vout is not quite equal to the input set voltage VsetØ, the error introduced by the finite gain of circuit 320 is very small. For example, if circuit 320 has a gain of 10,000 and Vout is 1 volt lower than VsetØ and VfgØ when circuit 30 settles, VfgØ will have an error of 1V/10,000, or only 0.1 mV.

Circuit 30 also preferably includes current sources I2 and IpØ, and a capacitor CpØ. Current source I2 is coupled between node 12 and a high voltage supply HV+ at node 13 for establishing Vefb at the beginning of the set mode and for providing tunnel current through TFØ. Current source I2 can be implemented using any number of conventional methods. However, current source I2 is preferably a current regulator that is biased by HV+, such as a current mirror comprising P-Channel devices that operate in the prethreshold region. In this manner, current source I2 will automatically go to whatever positive voltage needed at node 12 to establish the tunnel current through tunnel device TFØ. Current source I2 preferably generates a current that is about the same as IpØ. This means the current through tunnel device TFØ is about the same as the current through tunnel devices TeØ and TpØ.

Current source IpØ is coupled between node 3 and ground g1. Current source IpØ is preferably a P-Channel charge pump that is used as a negative current source to pump a controlled tunnel current out of programming tunnel device TpØ. As mentioned above, since IpØ is a current source, it functions to automatically goes to whatever negative voltage at node 3 that is needed to establish the tunnel current at the desired level. Current source IpØ has sufficient voltage compliance to provide this negative voltage. Moreover, once the current through the tunnel devices is established, the voltage across the tunnel devices is also well defined by their Fowler-Nordheim characteristics. Therefore, current source IpØ produces Vp, the voltage at node 3, by controlling the current through tunnel device TpØ. Using a current source IpØ is the preferred way to assure that tunnel devices TeØ and TpØ are operating at a current level that is high enough to allow dual conduction and to allow the feedback circuit to work; but low enough to avoid excessive current flow which damages the tunnel devices. Capacitor CpØ controls the discharge of current through the tunnel devices when, as explained in more detail below, IpØ is shut down at the conclusion of the set mode.

Those skilled in the art will realize that Vp can also be produced using a fixed voltage supply that is about 24 to 30 volts below Vefb. However, this topology should be used with caution because the current in Fowler-Nordheim tunnel devices varies exponentially with the applied voltage. In particular, very high current will flow through the tunnel devices if the voltage differential is too high, and extremely low current may flow if the voltage differential is too low. Very high currents will damage or "wear out" the tunnel devices due to rapid charge trapping in the dielectric, and if the tunnel current is too low, the feedback circuit will not be able to tunnel charge onto or off of fgØ, and thus will not be able to control the voltage on fgØ. Moreover, it is also possible to connect Vefb to a current source and connect Vp to the feedback circuit such that Vp controls the voltage on fgØ. However, this would require the feedback circuit to produce a controlled negative voltage, which is more difficult to integrate in a standard CMOS process.

Figure 5:
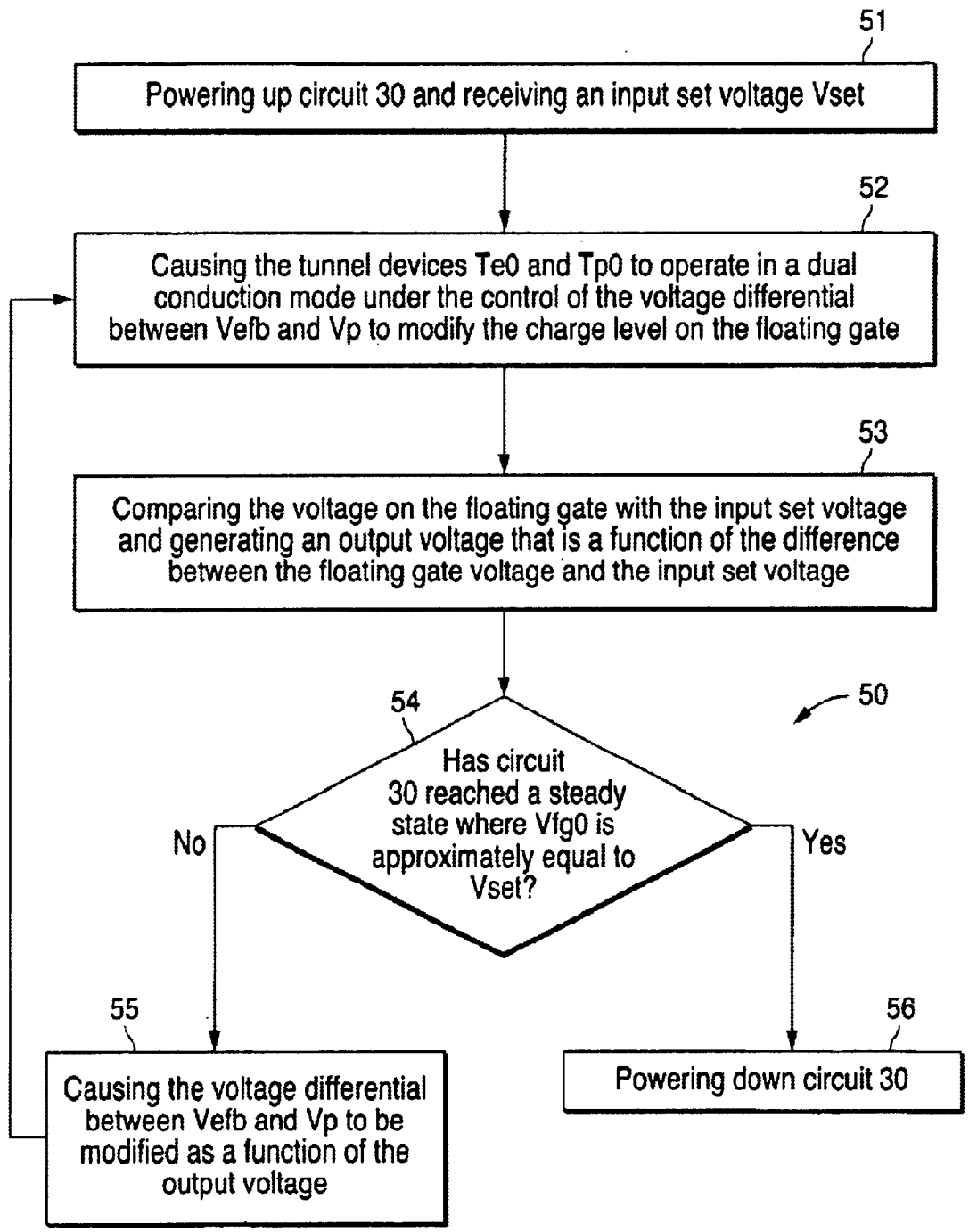
FIG. 5 is a flow diagram illustrating a method for setting a floating gate using the single floating gate circuit.

FIG. 5 is a flow diagram illustrating a method 50 for setting a floating gate that may be implemented during a set mode, for instance, by circuit 30 of FIG. 3. FIGS. 6A–8D illustrate voltage waveforms for Vout, Vp, Vefb, VfgØ and VsetØ, for the specific implementation of method 50 discussed below relative to those figures. Each of the four waveforms shown in FIGS. 6A–8D are the same, only the voltage axes of some of these waveforms are modified to illustrate specific details. In the circuit implementation illustrated in FIGS. 6A–8D: VsetØ=4.00V; Vcc=+5V, HV+ is about 22V, IpØ is about 6 nA, I2 is about 6 nA, ItØ is about 5 nA; and IgØ is about 20 nA.

At step 51, circuit 30 is powered up at the beginning of the set mode, which is illustrated in FIGS. 6A–8D as time $t_o$, and at some point thereafter receives input set voltage VsetØ. FIGS. 6A–8D further illustrate VsetØ being held at a constant voltage of 4.00V. In addition Vcc is set to +5V, HV+ is ramped up to a high positive voltage of about +22V, which turns on I2, and current source IpØ is turned on to enable this current source to begin generating its corresponding current. Thereafter, according to the preferred implementation of the remaining steps 52–56 of method 50, circuit 30 can set VfgØ to within about 0.5 mV of VsetØ in about 30 mSec, as illustrated in FIGS. 6A–8D.

At step 52, circuit 30 causes tunnel devices TeØ and TpØ to operate in a dual conduction mode under the control of the voltage differential between the erase and programming electrodes EeØ and EpØ, respectively, for modifying the charge level on floating gate fgØ. Dual conduction occurs when tunnel current flows through both TeØ and TpØ. Tunnel current flows through TeØ and TpØ when the voltage differential between the erase and programming electrodes is at least two tunnel voltages or approximately 22V as discussed earlier.

Preferably, circuit 30 causes dual conduction in the following manner. Current source I2 pulls node 12, Vefb, up relatively quickly to about +18V. Vefb (node 12) turns on transistor T6, which pulls VeØ (node 4) to one Vt below Vefb. Charge pump IpØ gradually charges capacitor CpØ and ramps Vp (node 3) down to a negative voltage of about −11V in about 2 mSec. Once Vp ramps down to the point where the difference between VeØ and Vp is at least two tunnel voltages, tunnel current flows through both tunnel devices TeØ and TpØ, under the control of IpØ, and VfgØ is controlled directly by Vefb. I2 continues to pull up Vefb until Vefb reaches Vout+1TV+1Vt, where 1 TV is the tunnel voltage across tunnel device TFØ, and 1Vt is the threshold voltage of transistor T7. When at least one tunnel voltage exists across TFØ tunnel current flows through TFØ, and TFØ and T7 act as level shift devices such that Vefb is controlled directly by Vout. At step 53, circuit 30 compares VfgØ with VsetØ and generates an output voltage Vout that is a function of the difference between VfgØ and VsetØ. Circuit 30 then, at step 55, causes the voltage differential between Vefb and Vp to be modified as a function of Vout, by modifying Vefb, and circuit 30 repeats steps 52 through 55 until circuit 30 settles to a steady state condition, at step 54, where VfgØ is approximately equal to VsetØ. At this point circuit 30 is powered down, at step 56. As a result of method 50, fgØ is set to a charge level that will remain essentially the same over time.

The voltage waveforms of FIGS. 6A–8D illustrate how circuit 30 functions during steps 52 through 55. Dual conduction occurs after about 0.5 mSec, which is illustrated as time $t_1$ in FIGS. 6A–8D. Prior to time $t_1$, Vout=ØV, Vefb is pulled up by I2, and VfgØ is not controlled by Vefb. However, once tunnel current is flowing through TeØ, TpØ and TFØ at time $t_1$: the differential stage senses that VfgØ is not equal to VsetØ; Vout is a function of the difference between VfgØ and VsetØ; Vefb follows Vout; and VfgØ follows Vefb. For about the next 2.5 mSec, which is illustrated as time $t_1$ to time $t_2$ in FIGS. 6A–8D, VfgØ oscillates above and below VsetØ as Vefb moves up and down as a function of the negative feedback loop.

Figure 6A:
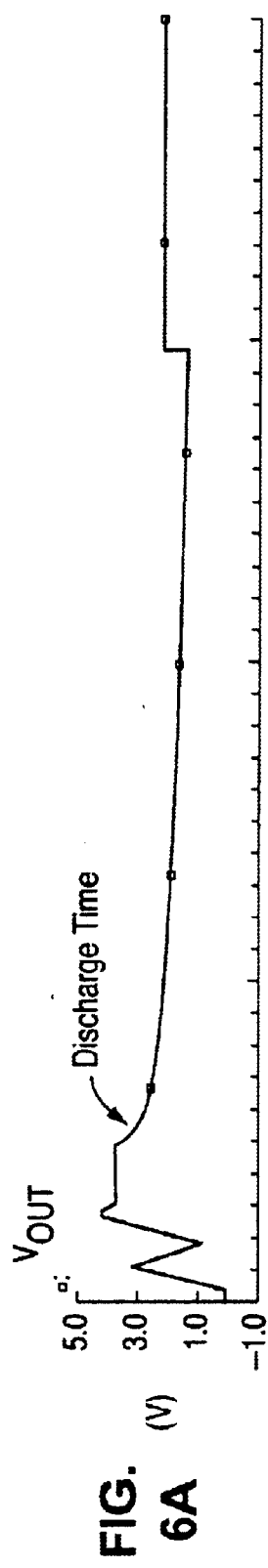
FIGS. 6A–6D illustrate various voltage waveforms vs. time for a specific implementation of the method of FIG. 5.
Figure 6B:
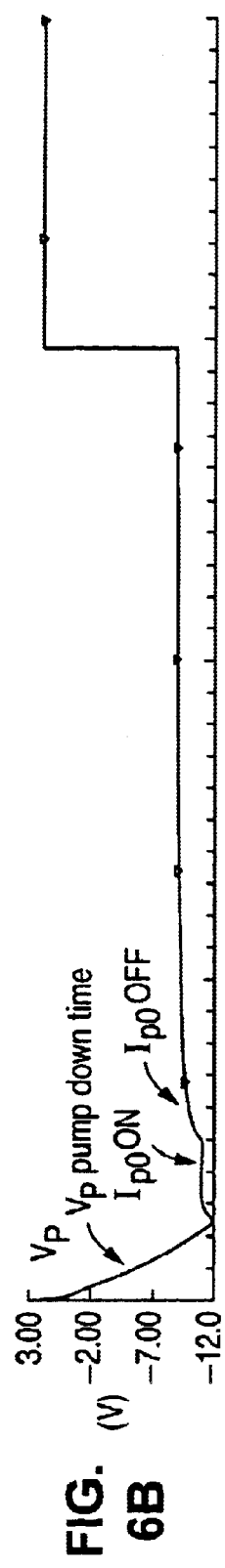
Figure 6C:
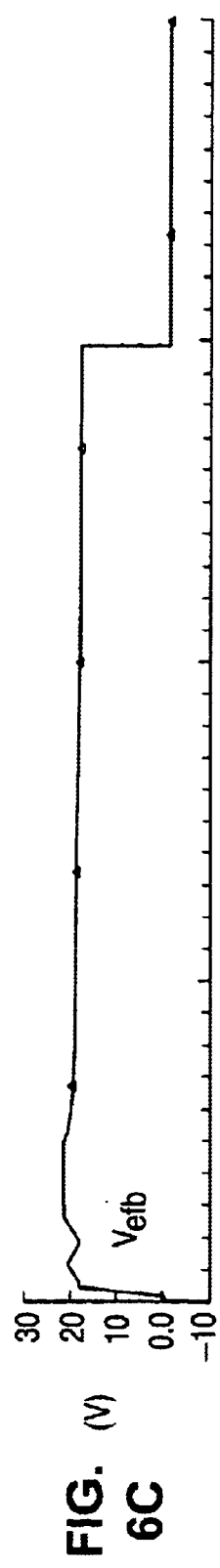
Figure 6D:
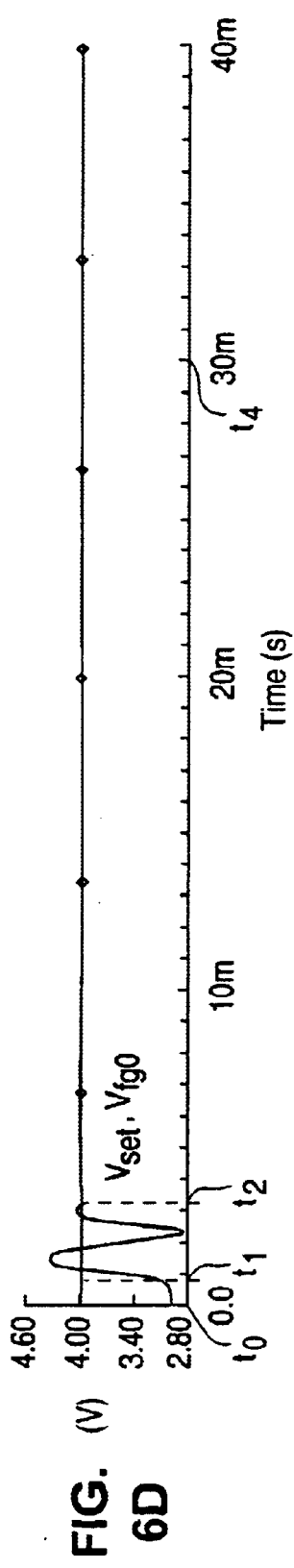
Figure 7A:
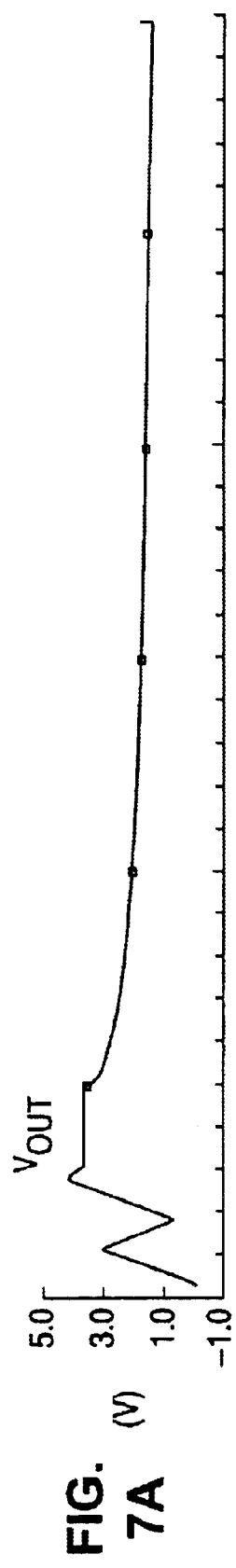
FIGS. 7A–7D illustrate various voltage waveforms vs. time for a specific implementation of the method of FIG. 5.
Figure 7B:
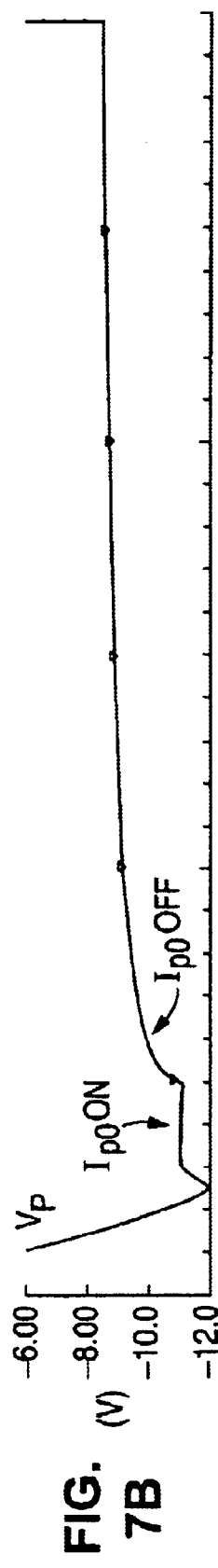
Figure 7C:
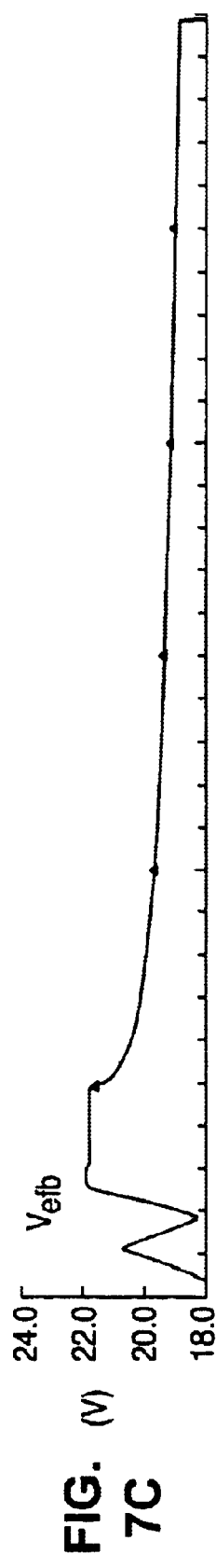
Figure 7D:
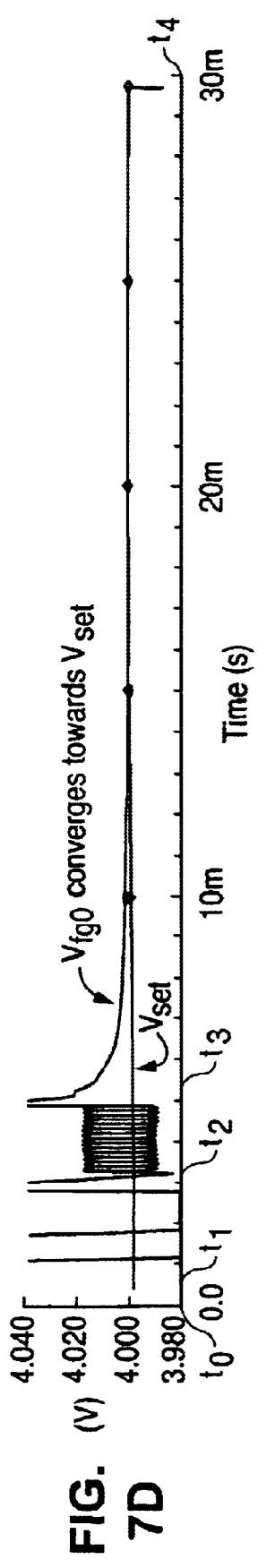

At the beginning of this oscillation period at time $t_1$, it can be seen in FIG. 6D that VfgØ is below VsetØ. Thus, transistor T1 is OFF and transistor T2 is ON, which pulls down node 7. This turns on transistor T5, which quickly pulls up Vout from zero volts, as illustrated in FIG. 6A. Since tunnel current is flowing through TFØ, TFØ and T7 act as level shifters such that Vefb pulls up 1TV and 1Vt above Vout. Vefb then pulls up VfgØ through tunnel device TeØ. Since Vp is continuing to ramp down to a predetermined negative voltage, VfgØ is pulled greater than VsetØ after about 1 mSec. At that point, the differential stage 322 senses that VfgØ is greater than VsetØ, and the gain stage 324 amplifies that difference, quickly pulling Vout low, which pulls Vefb low and pulls VfgØ back down low. When VfgØ is approximately equal to VsetØ, circuit 320 ceases to oscillate except for some noise coupled to circuit 320 from the charge pump IpØ, as best shown in FIGS. 7A–8D beginning at time $t_2$.

Beginning at time $t_1$, current source IgØ in the gain stage 324 produces a current that is much larger than that generated by current source I2. Therefore, the gain stage 324 is able control Vout by sinking all the current from I2 that flows through T7 and TFØ to Vout. In addition, the compensation capacitor C2 in the gain stage 324 is made large enough to assure the feedback loop is stable and settles in less than about 1 mSec. The level shift in Vefb caused by the Vt across T7 approximately matches the voltage drop in T6. The level shift in Vefb caused by the tunnel voltage across TFØ approximately matches the voltage drop across tunnel device TeØ, so that when the differential and gain stages settle, VfgØ and Vout are about the same. This can be seen in FIGS. 8A and 8D where Vout settles to within about 30 mV of VfgØ, beginning at time $t_2$. This 30 mV difference is generated by noise coupled to fgØ from the IpØ current source. Specifically, negative charge pump IpØ, which pumps charge from the program tunnel device TpØ, produces noise on Vp. This noise is coupled to floating gate fgØ through program tunnel device capacitance CpØ. The noise on Vp cannot be seen in the Vp waveform in FIGS. 8B because the voltage axis is shown in volts, whereas the voltage axis for the VfgØ vs. VsetØ waveform is shown in millivolts.

Referring again to FIG. 5, once circuit 30 settles at step 54 such that VfgØ is approximately VsetØ, circuit 30 is powered down at step 56. Powering down circuit 30 ramps Vefb and Vp toward ground as seen beginning at $t_3$ in FIGS. 7B, 7C, 8C and 8D. Step 56 may be performed by simply concurrently shutting off the charge pump IpØ and HV+, and thereby current source I2, at time $t_3$. However, this may significantly impact VfgØ once Vefb and Vp have ramped back to ØV. As explained above, noise from IpØ limits the accuracy of setting VfgØ equal to VsetØ when the negative charge pump that generates Vp is ON. This means VfgØ may not be equal to VsetØ at the beginning of the ramping of Vefb and Vp to ground. If VfgØ is not equal to VsetØ when this ramp down begins, then VfgØ will not equal VsetØ after Vp and Vefb reach ØV. Moreover, during the ramp down, the current that continues to flow through tunnel devices TeØ and TpØ is typically not the same. This further affects the final charge level on floating gate fgØ.

To overcome this limitation and thereby maintain the same charge level on floating gate fgØ during the ramping of Vefb and Vp to ground, the current in the erase and program tunnel devices must be the same during this time. In order to maintain the same current in both tunnel devices, the voltage across each of the tunnel devices must be the same, which means Vefb must ramp down to ØV at the same rate as Vp ramps up to ØV. Also the tunnel device characteristics must be well matched.

Figure 8A:
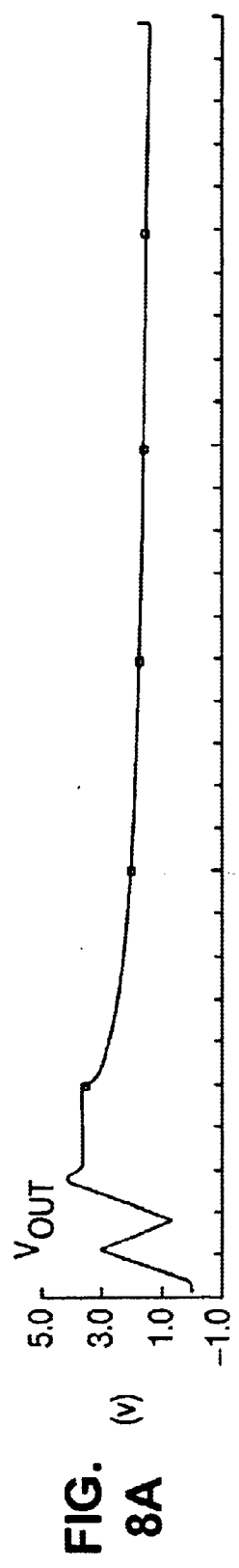
FIGS. 8A–8D illustrate various voltage waveforms vs. time for a specific implementation of the method of FIG. 5.
Figure 8B:
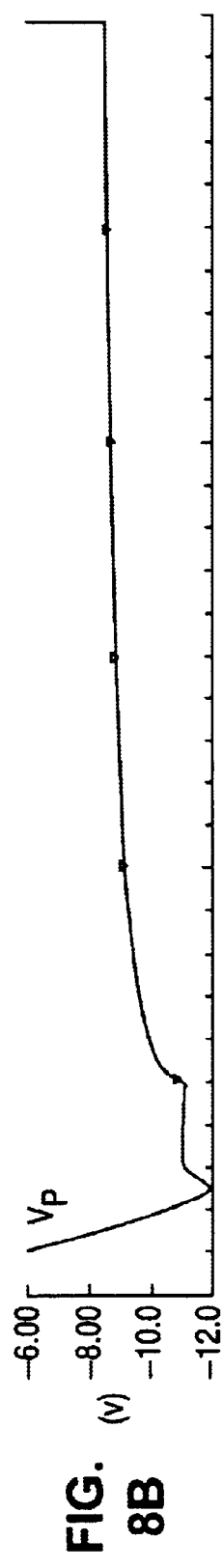
Figure 8C:
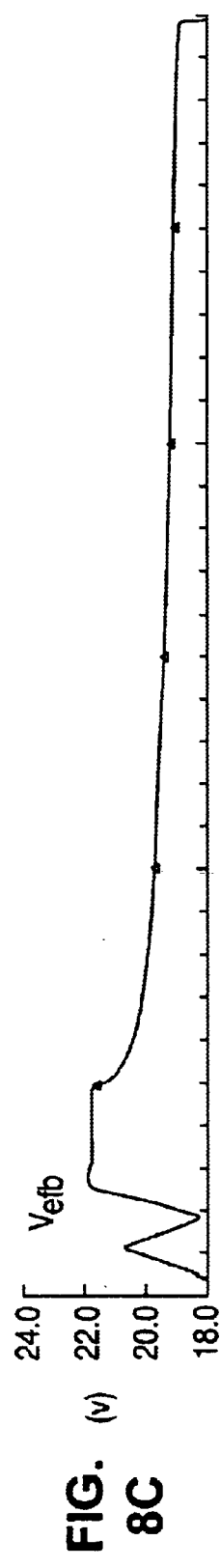
Figure 8D:
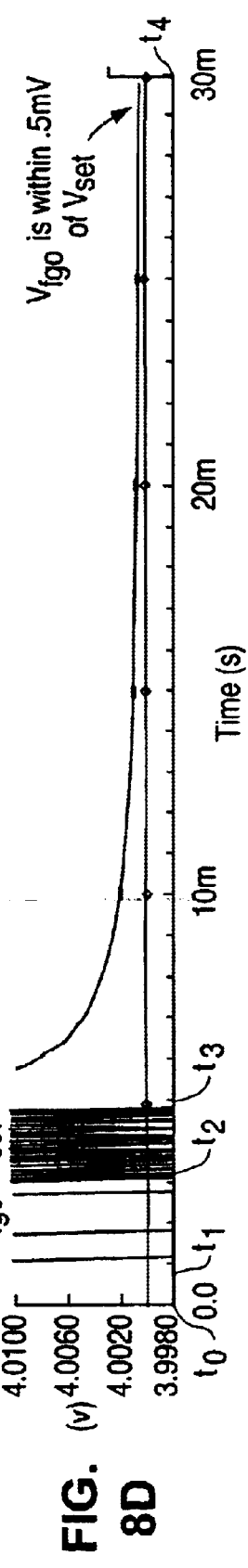

Accordingly, circuit 30 should be powered down, at step 56, in the following preferred manner. Once circuit 320 and the feedback circuit have stabilized for a time and it is clear that further accuracy to setting VfgØ is limited primarily by the charge pump noise, shown beginning at $t_2$, IpØ is shut off at $t_3$ to eliminate the pump noise. However, HV+, and thereby current source I2, are left on such that the feedback circuit is still active and continues to control Vefb. At the point when the negative charge pump is shut off, tunnel current continues to flow through TeØ and TpØ as CpØ discharges, which pulls up Vp back towards ØV. This tunnel current and the capacitance CpØ determine the ramp rate on Vp. As Vp ramps up, the voltage on floating gate fgØ is capacitively coupled upwards. Circuit 320 senses VfgØ moving upwards and ramps Vefb down towards ØV through the feedback circuit. As Vefb ramps down and Vp ramps up, the tunnel current in tunnel devices TeØ and TpØ decreases rapidly due to the steep slope of their Fowler-Nordheim tunnel device characteristics. Since feedback response time depends directly on the current in the erase tunnel device, the feedback circuit response slows down as Vefb ramps down. As the tunnel current decreases, both the ramp rate and feedback response times slow down and VfgØ gradually moves closer to VsetØ. For instance, FIG. 8D shows that VfgØ has converged to within about 0.5 mV of VsetØ for a set mode time of 30 mSec, and VfgØ may be set even more accurately by allowing a ramp down time of greater than 30 mSec. After VfgØ is allowed to converge on VsetØ for an amount of time determined by the level of accuracy desired, the HV+ voltage supply and thereby the I2 current source can be shut off, for instance at $t_4$, without affecting the charge on fgØ. Moreover, Vcc may be shut off. In other words, once VfgØ is detected as being within a predetermined threshold level of VsetØ, a steady state condition has been reached and power to circuit 30 can be shut off without affecting the value of VfgØ.

It is important that the response of the feedback circuit is slow enough to assure VfgØ is always slightly above VsetØ so circuit 320 and the feedback circuit continue to ramp Vefb down. If VfgØ goes below VsetØ and the feedback switches the direction Vefb is ramping, the feedback system will start to oscillate very slowly and VfgØ will diverge from VsetØ instead of converge towards VsetØ. After Vefb and Vp have ramped a few volts towards ØV and VfgØ is very close to VsetØ, Vefb and Vp can be ramped to ØV quickly, as illustrated at time $t_4$ in FIGS. 6B and 6C, by shutting off HV+ because the current in TeØ and TpØ is so low it no longer affects the charge on the floating gate fgØ. CpØ must be carefully set to assure that as Vp rises to ØV, the feedback path through the differential stage 322, gain stage 324, TFØ level shift and TeØ devices to floating gate fgØ is able to ramp down Vefb and move VfgØ closer and closer to VsetØ. If CpØ is too small: Vp rises very quickly; the delay through the feedback path causes Vefb to ramp down too slowly; and VfgØ will rise above VsetØ instead of converging towards VsetØ. If CpØ is too large, the response of the feedback path is too fast and Vefb is ramped down too much, such that VfgØ may undershoot which causes the circuit to oscillate slowly. If circuit 320 is allowed to oscillate, VfgØ will tend to diverge instead of converge towards VsetØ. Accordingly, CpØ is designed such that the feedback response time is slightly slower than the discharge rate of CpØ. Preferably CpØ should be set at about 2.4 pf.

At the end of the set mode, at time $t_4$, floating gate fgØ will then continue to indefinitely store the charge level programmed on floating gate fgØ during the set mode, subject to possible charge loss, e.g., due to detrapping of electrons or dielectric relaxation over time, without any external power being supplied to circuit 30. In addition, although in the example illustrated above VfgØ was set to be equal to VsetØ, those of ordinary skill in the art will realize that in another embodiment of the present invention, circuit 30 can he configured such that VfgØ is set to a voltage that is some other predetermined value of VsetØ.

With the above understanding of the differential floating gate circuit 30 of FIG. 3 and of the method 50 of setting floating gate fgØ illustrated by the flow diagram in FIG. 5, we now turn to the differential dual floating gate circuit 40 of FIG. 4A. Circuit 40 preferably comprises a reference floating gate fgr at a node 15 and a second floating gate fg1 at a node 14. At the conclusion of a set mode, both floating gates fgr and fg1 are programmed, respectively, to charge levels such that the difference in charge level between fgr and fg1 is a function of an input set voltage capacitively coupled to fgr during the set mode. Thereafter, during a read mode, circuit 40 may be configured as a voltage reference circuit such that an output reference voltage is generated that is a function of the input set voltage and is preferably equal to the input set voltage. The set mode may be instituted at the factory to cause fgr and fg1 to be set to their respective desired charge levels, and thereby, to cause circuit 40 to generate a desired output reference voltage whenever circuit 40 is later caused to enter its read mode. Alternatively, a later user of circuit 40 can cause circuit 40 to enter a set mode whenever the user wishes, to thereby update the difference in charge levels between fgr and fg1 as a function of the VsetØ voltage input and thus to update the output reference voltage generated by circuit 40 during subsequent read mode.

The sequence used to program floating gates fgr and fg1 in circuit 40 is similar to the sequence used to set the charge level on floating gate fgØ in circuit 30 of FIG. 3. One major difference between the previously described single floating gate circuit 30 and the dual floating gate circuit 40 is that the gate of transistor T2 in FIG. 3 is replaced by a floating gate, fg1, in FIG. 4A, that cannot be connected directly to an external voltage. In order to set the voltage on fg1, a voltage Vx is coupled at a node 27 to the gate of a transistor T15 in circuit 40, such that Vfg1 is set to Vx−1Vt−1TV, where 1Vt is the threshold voltage of transistor T15 and 1TV is the tunnel voltage of an erase tunnel device Te1.

Figure 4B:
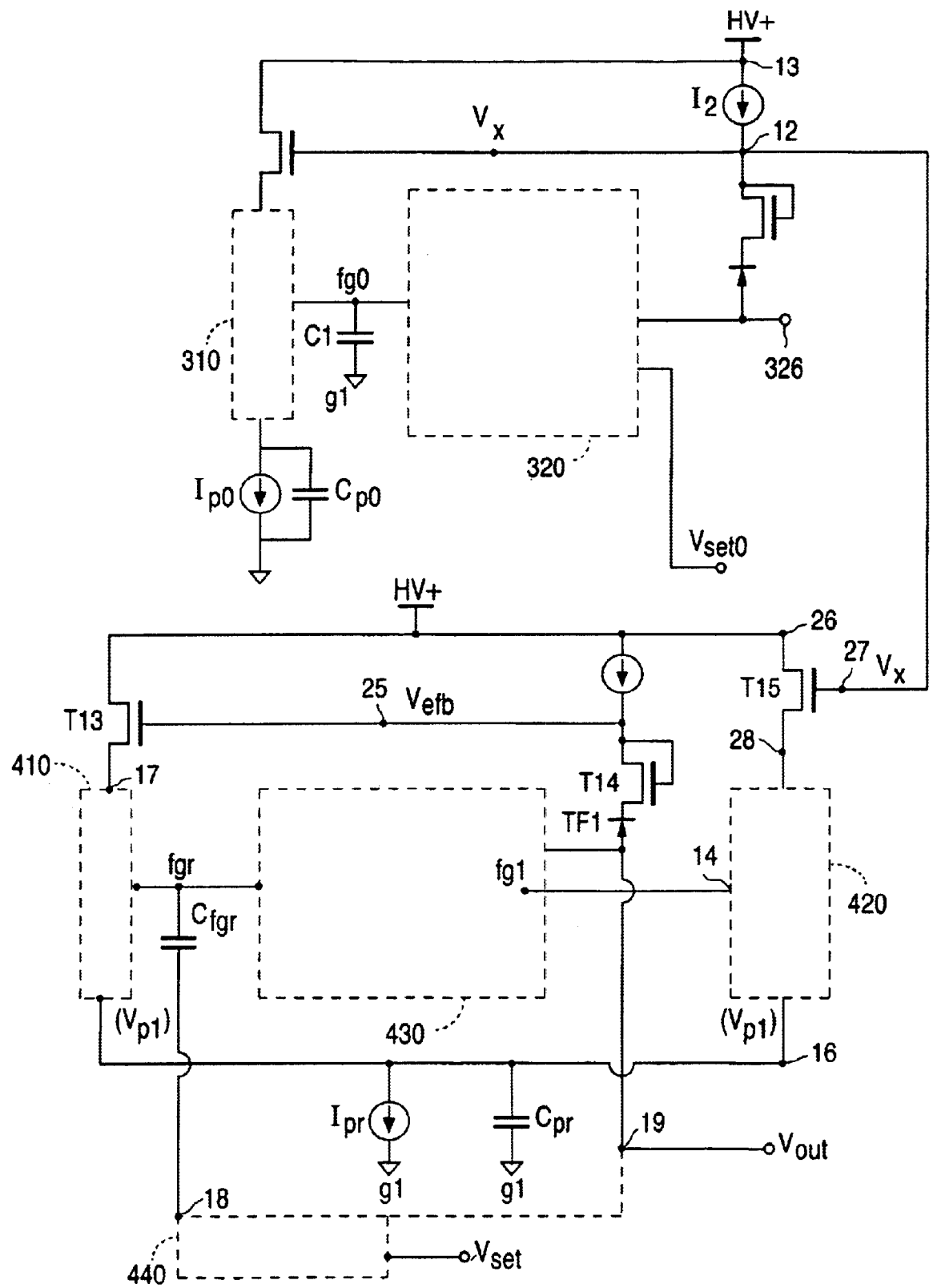
FIG. 4B is a combined schematic and block diagram illustrating the single floating gate circuit coupled to the dual floating gate circuit during a set mode.

In a preferred embodiment, Vx is generated by a second floating gate voltage reference circuit, e.g., circuit 30. FIG. 4B is a combined schematic and block diagram illustrating this embodiment. Circuits 30 and 40 in FIG. 4B are identical to the circuits illustrated, respectively, in FIGS. 3 and 4A. In the embodiment shown in FIG. 4B, a high voltage set cycle is performed on both the single floating gate differential circuit 30 and the dual floating gate differential reference circuit 40 at the same time. During the set mode, circuit 30 generates the voltage at node 12 such that floating gate fgØ is set as described earlier, wherein VsetØ for circuit 30 is an internally or externally supplied predetermined voltage, such as +4 v. Floating gate fg1 is therefore set to a voltage that is a predetermined function of the voltage on floating gate fgØ, and is preferably set to be approximately equal to VfgØ assuming the tunnel devices in both differential circuits, i.e., circuits 30 and 40, are reasonably well matched. The voltage set on floating gate fg1 is then used to set the voltage on floating gate fgr, such that Vfgr is a predetermined function of Vfg1, and preferably approximately equal to Vfg1, as described in greater detail below.

Circuit 40 further comprises a circuit 410 that includes: a programming tunnel device Tpr formed between floating gate fgr and a programming electrode Epr, at a node 16; an erase tunnel device Ter formed between floating gate fgr and an erase electrode Eer, at a node 17; and a steering capacitor Cfgr coupled between floating gate fgr and a node 18. Circuit 40 also comprises a circuit 420 that includes: a programming tunnel device Tp1 formed between floating gate fg1 and a programming electrode Ep1, at node 16, and an erase tunnel device Te1 formed between floating gate fg1 and an erase electrode Ee1, at a node 28. Preferably, programming electrodes Epr and Ep1 receive a negative voltage during the set mode, and erase electrodes Eer and Ee1 receive a positive voltage during the set mode. Moreover, tunnel devices Tpr, Tp1, Ter and Te1 are preferably Fowler-Nordheim tunnel devices that are reasonably well matched as a result of their chip layout, and these tunnel devices are ideally reasonably well matched with tunnel devices TpØ and TeØ of circuit 30.

Also included in circuit 40 is a steering capacitor Cfg1 coupled between floating gate fg1 and a node 32. The bottom plate of steering capacitor Cfg1 is coupled to a predetermined voltage during the set mode that is preferably ground g1. Steering capacitor Cfg1 is used to provide a stable ground reference for floating gate fg1 . Circuit 40 also includes a transistor T15 that has its drain coupled to a high voltage supply HV+, at a node 26, its source coupled to node 28, and its gate coupled to node 27.

Setting a voltage on floating gate fgr during the set mode is achieved by taking electrode Epr negative and electrode Eer positive such that the voltage at node 17 minus the voltage at node 16 is two tunnel voltages or approximately 22V. The dual conduction current at 22V is typically approximately one to two nanoamps. An alternative is to create a sufficient voltage differential across electrode Epr and electrode Eer to generate a current flow of approximately 5 nA from node 16 to node 17. In either case, both tunnel devices are conducting, i.e., the tunnel devices are in "dual conduction." By operating in dual conduction, the voltage on the floating gate fgr can stabilize at a DC voltage level for as long a time as needed to enable circuit 40 to end the set mode process in a controlled fashion such that the voltage on floating gate fgr settles to a very precise and accurate level. Operating in dual conduction with feedback through at least one of the tunnel devices is key to making it possible to set the floating gate fgr voltage very accurately.

In dual conduction, the tunnel devices Ter and Tpr, which are reasonably well matched by layout, will modify the charge level on floating gate fgr by allowing electrons to tunnel onto and off of floating gate fgr so as to divide the voltage between nodes 17 and 16 in half. Thus, the floating gate voltage, i.e., the voltage at node 15, will be Vfgr=Vnode16+(Vnode17−Vnode16)/2, which is halfway between the voltage at node 17 and the voltage at node 16. Under these conditions, the dual conduction current can typically charge or discharge node 15, which typically has less than 1.0 pF capacitance, in less than 1 mSec. As this occurs, the floating gate voltage "tracks" directly with the voltage at nodes 16 and 17 and settles to a DC voltage that is half way between those two voltages in a few mSec. Accordingly, Vfgr can be set to a positive or negative voltage or zero volts depending upon the value of the voltages existing at electrodes Eer and Epr. For example, if the tunnel voltage is approximately 11V for the erase and program tunnel devices Ter and Tpr, and the voltage at electrode Eer is set to about +16V and the voltage at electrode Epr is set to about −6V, then Vfgr will settle at about +5V, which is the midpoint between the two voltages. If the voltage at Eer is set to about +11V and the voltage at Epr is set to about −11V, then Vfgr will go to about ØV. If the voltage at Eer is set to about +6V and the voltage at Epr is set to about −16V, then Vfgr will go to about −5V.

As stated earlier, circuit 40 programs both floating gates fgr and fg1 during the set mode. Correspondingly, tunnel devices Tp1 and Te1 similarly operate in dual conduction to modify the charge level on floating gate fg1 by allowing electrons to tunnel onto and off of floating gate fg1 so as to divide the voltage between nodes 28 and 16 in half. In addition, if circuit 30 is used during the set mode to generate the voltage Vx at node 27 in circuit 40, ideally, the tunnel currents in both circuits 30 and 40 are reasonably well matched, and transistors T13, T14, T15 are reasonably well matched, such that when circuits 30 and 40 settle, Vfgr=Vfg1=VfgØ. Although this condition is preferable, circuit 40 will set Vfgr=Vfg1 even where floating gate fg1 is not set exactly equal to floating gate fgØ, since floating gates fg1 and fgØ are not in the same differential circuit.

Circuit 40 further includes a circuit 430 that compares Vfgr, the voltage on floating gate fgr to Vfg1, the voltage on floating gate fg1, and that generates an output voltage Vout, at node 19, that is a function of the difference between the voltages on floating gates fgr and fg1. Circuit 430 preferably includes a differential amplifier (or differential stage) 432 that is preferably configured to have a non-inverting input coupled to floating gate fg1 and an inverting input coupled to floating gate fgr. Circuit 430 further includes a gain stage 434 with an input coupled to node 20 and an output terminal 436, at node 19. The differential stage 432 compares the voltages received at its inputs and amplifies that difference, typically by a factor of 50 to 100. The gain stage 434 then further amplifies that difference by another factor of 50 to 100. Moreover, at the conclusion of the set mode, Circuit 430 ideally settles to a steady state condition, such that Vfgr=Vfg1=Vout.

Referring again to FIG. 4B, the differential stage 432 preferably includes enhancement mode transistors T8, T9, T10 and T11. Transistors T8 and T9 are preferably NMOS transistors that are reasonably well matched by layout, and transistors T10 and T11 are preferably PMOS transistors that are reasonably well matched by layout. The sources of NMOS transistors T8 and T9 are coupled together at a node 21. The drain of NMOS transistor T8 is coupled to a node 22, and its gate is floating gate fgr. The drain of NMOS transistor T9 is coupled to a node 20, and its gate is floating gate fg1. PMOS transistor T10 is coupled common drain, common gate, to node 22, with its source coupled to a node 23. The gate of PMOS transistor T11 is coupled to at node 22. Its drain is coupled to node 20, and its source is coupled to node 23. A voltage supply Vcc, typically 3 to 5 volts, is coupled to node 23, and a current source Itr is coupled between node 21 and ground g1 to cause transistors T8, T9, T10 and T11 to operate in either the prethreshold or linear region during the set mode. Current source Itr can be generated using any number of conventional circuits.

The gain stage 434 preferably includes a PMOS pullup transistor T12 biased by Vcc and a current source pull-down load Igr. The source of transistor T12 is coupled to node 23. Its gate is coupled to the differential stage pull-up transistor T11 at node 20, and its drain is coupled to node 19. Current source pull-down load Igr is coupled between node 19 and ground g1. The gain stage 434 also preferably includes a compensation capacitor C3 coupled between nodes 19 and 20. Current source pull-down load Igr is preferably an active load using an NMOS current mirror or a depletion device. Using an active current source with relatively high output resistance, the gain stage 434 can provide a voltage gain of about 100. The output swing of the gain stage 434 is nearly full rail from ground to Vcc. Stability and response of this circuit can be easily adjusted for various processes using compensation capacitor C3. In this configuration, transistor T12 provides good current sourcing capability, but current sinking is limited to the current in the current source pull-down Igr. Therefore, the current in Igr should be greater than the pull-up current required by the load on Vout so that the gain stage 434 is capable of adequately controlling Vout by sinking all of the current that flows to Vout.

Circuit 430 further operates in the following manner. When biased by Vcc and current source Itr, T8 senses Vfgr relative to Vfg1, which is sensed by transistor T9, and the amplified difference appears as Vout at node 19. If Vfgr is initially less than Vfg1, T9 is turned on more than T8, and the current flow through T9 (and through T11 since they are connected in series) is initially greater than the current flow through T8 (and correspondingly T10). The gate of the pullup transistor T10 is tied to the drain of T10 and also to the gate of pullup transistor T11, which makes the current in T11 a mirror of the current in transistor T10. When more current flows through T11 than T10, the voltage, V20, on node 20 drops below the voltage V22, on node 22. The lower voltage on node 20 causes the current through transistor T12 to increase, which pulls Vout high. The voltage gain of the differential stage 432 is typically about 80 and the voltage gain of the gain stage 434 is typically about 100 giving an overall gain from Vfg1 to Vout of about 8000. A negative feedback path from Vout to the inverting input fgr is necessary for circuit 430 to settle at the point where the voltage on fgr is equal to the voltage on fg1. During the set mode, this feedback path is provided by tunnel devices TF1 and Ter and transistors T13 and T14 as described in the next section. When Vout goes high, the negative feedback path pulls Vfgr higher. As Vfgr rises, the current in transistor T8 increases until it matches the current in transistor T9. At this point the differential circuit 430 settles at the point where the currents in transistors T8, T9, T10 and T11 match and Vfgr=Vfg1.

Those skilled in the art will realize that circuit 430 can be implemented using PMOS transistors for T8 and T9 and NMOS transistors for T10 and T11. For this implementation, the gain stage 434 preferably comprises an NMOS pull-down transistor T12 coupled to a current source pull-up load Igr.

Circuit 40 also includes a feedback loop coupled between nodes 19 and 15. During the set mode, this feedback loop causes the voltage differential between tunnel electrodes Eer and Epr to be modified by modifying the voltage at node 17 as a function of the voltage at node 19. The feedback loop preferably comprises a level shift circuit, preferably a tunnel device TF1 formed between node 19 and a node 24, and a transistor T14, preferably an NMOS transistor, coupled common gate, common drain at a node 25, with its source coupled to node 24. Also included in the feedback loop is a transistor T13, preferably an NMOS transistor, having its gate coupled to node 25, its source coupled to node 17, and thereby to erase tunnel device Ter, and its drain coupled to node 26.

As earlier indicated, the maximum output of the gain stage 434 is approximately Vcc. However, this is not high enough to drive the voltage at node 25 (Vefb) directly, because Vefb typically needs to go to about 14 to 19 volts, which is well above the usual 3 to 5 volt Vcc supply level. The level shift circuit TF1 and T14 shifts the low output voltage at node 19 (Vout) up to the desired 14 to 19 volt range. Preferably, TF1 and Ter are reasonably well matched by layout and T13 and T14 are reasonably well matched by layout. Under these conditions, when the same tunnel current flows through both TF1 and Ter, the level shift tracks the erase tunnel voltage as measured by the voltage drop from node 17 to node 15 which drives the gate of transistor T8 (fgr) to the same voltage as the voltage on the gate of transistor T9 (fg1) when circuit 430 settles. This adds to the improved setting accuracy of the circuit.

One advantage of having the level shift track the erase tunnel voltage is that, as the voltage necessary to create tunneling changes, due to charge trapping in the dielectric as more and more set cycles are performed, the circuit 430 output, Vout, continues to follow Vfg1 and operate in the same voltage range. Another advantage is that when the output voltage Vout is not equal to Vfgr, the error introduced by the finite gain of circuit 430 is very small. For example, if circuit 430 has a gain of 10,000 and Vout is 1 volt lower than Vfg1 minus Vfgr when circuit 40 settles, Vfg1 minus Vfgr will have an error of 1V10,000, or only 0.1 mV.

Circuit 40 also preferably includes current sources I2r and Ipr, and a capacitor Cpr. Current source I2r is coupled between node 25 and HV+ at node 26 for establishing Vefb at the beginning of the set mode and for providing tunnel current through TF1. Current source I2r can be implemented using any number of conventional circuits. However, current source I2r is preferably a current regulator that is biased by HV+, such as a current mirror comprising P-Channel devices that operate in the prethreshold region. In this manner, current source I2r will automatically go to whatever positive voltage is needed at node 25 to establish the tunnel current through tunnel device TF1. Moreover, current source I2r preferably generates a current that is about half that of current source Ipr, so that the current through tunnel device TF1 is about the same as the current through tunnel devices Ter, Tpr, Te1, and Tp1.

Current source Ipr is coupled between node 16 and ground g1. Current source Ipr is preferably a P-Channel charge pump that is used as a negative current source to pump a controlled tunnel current out of programming tunnel devices Tpr and Tp1. Since Ipr is a current source, it automatically goes to whatever negative voltage at node 16 that is needed to establish the tunnel current at the desired level, assuming the current source has sufficient voltage compliance. Moreover, once the current through the tunnel devices is established, the voltage across the tunnel devices is also well defined by their Fowler-Nordheim characteristics. Therefore, current source Ipr produces Vp1, the voltage at node 16, by controlling the current through tunnel devices Tpr and Tp1. Using a current source Ipr is the preferred way to assure that tunnel devices Ter, Te1, Tpr and Tp1 are operating at a current level that is high enough to allow dual conduction and to allow the feedback circuit to work, but low enough to avoid excessive current flow which damages the tunnel devices. Capacitor Cpr, controls the rate of discharge of current through the tunnel devices when, as explained in more detail below, current source Ipr is shut down at the conclusion of the set mode. Moreover, when circuit 30 is used to generate the voltage Vx at node 27 in circuit 40 during the set mode, to achieve the ideal condition of setting Vfgr=Vfg1=VfgØ, preferably current sources I2r and I2 (of FIG. 3) are reasonably well matched, current source Ipr is about twice as large as current source IpØ (of FIG. 3), and capacitors Cpr and CpØ (of FIG. 3) are reasonably well matched. In addition, HV+ is the same in circuit 30 and in circuit 40.

Those skilled in the art will realize that Vp1 can also be produced using a fixed voltage supply that is about 24 to 30 volts below the voltage at nodes 17 and 28. However, this topology should be used with caution because the current in Fowler-Nordheim tunnel devices varies exponentially with the applied voltage. In particular, very high current will flow through the tunnel devices if the voltage differential is too high, and extremely low current may flow if the voltage differential is too low. Very high currents will damage or "wear out" the tunnel devices due to rapid charge trapping in the dielectric, and if the tunnel current is too low, the feedback circuit will not be able to tunnel charge onto or off of fgr, and thus will not be able to control the voltage on fgr. Moreover, it is also possible to connect erase electrode Eer to a current source and connect programming electrode Epr to the feedback circuit such that Vp1 controls the voltage on fgr. However, this would require the feedback circuit to produce a controlled negative voltage, which is more difficult to integrate in a standard CMOS process.

Finally, circuit 40 also preferably includes a circuit 440. Circuit 440 preferably comprises a switch S4 that is preferably a MOS transistor that is coupled between nodes 18 and 19 and a MOS transistor switch S5 coupled between node 18 and an input voltage terminal 450. In the set mode, switch S4 is OFF, and switch S5 is ON such that the input set voltage Vset can be coupled to the bottom plate of steering capacitor Cfgr.

Coupling input voltage Vset to terminal 450 during the set mode enables circuit 40 to program a charge level difference between floating gates fgr and fg1 that is a predetermined function of Vset. Thereafter during a subsequent read mode, circuit 40 generates a reference voltage that is a predetermined function of Vset, and is preferably equal to Vset. Specifically, during the set mode, the voltage programmed across capacitor Cfg1 is the same as that programmed on floating gate fg1, since Cfg1 is preferably coupled to ground during the set mode. Whereas, the voltage programmed across capacitor Cfgr is Vfgr (which is ideally equal to Vfg1) minus Vset. Thereafter, when power and Vset are removed at the conclusion of the set mode, node 18 goes to zero volts and Vfg1 remains the same, but Vfgr is equal to the voltage across Cfgr, which is equal to (Vfg1−Vset). Thus, a difference in charge level exists between floating gates fgr and fg1 that is equal to the difference in charge remaining on capacitors Cfg1 and Cfgr at the conclusion of the set mode. This difference in charge level between fgr and fg1, which is a predetermined function of Vset, is what causes a reference voltage to be generated at node 19 during a read mode for circuit 40 that is a predetermined function of Vset, and is preferably equal to Vset. To produce a voltage reference output equal to Vset, S5 is turned off and S4 is turned on, which connects Vset to node 18, which is coupled to fg1 through Cfgr. Vout settles at the voltage where Vfgr=Vfg1, which occurs when node 18=Vset.

Figure 9:
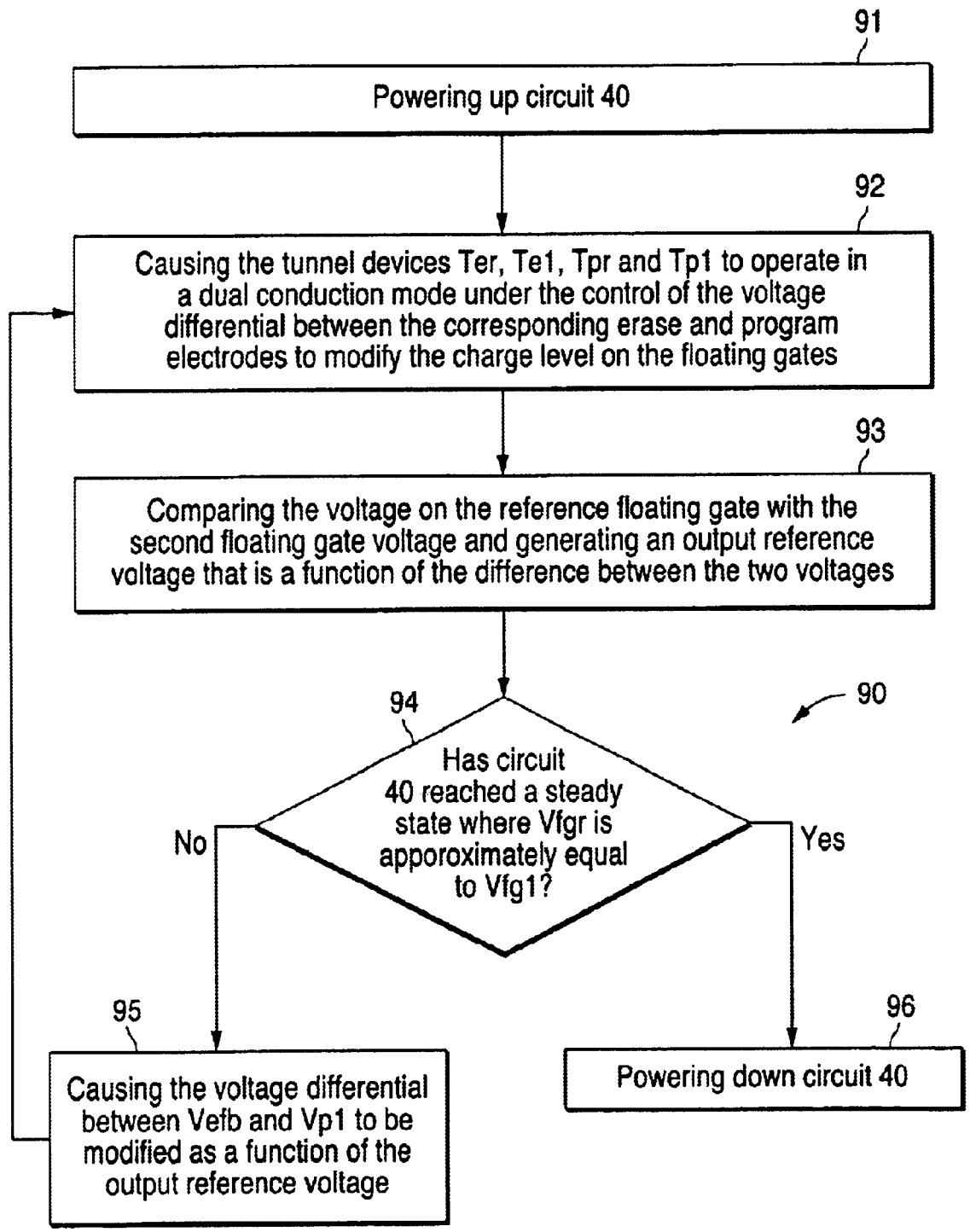
FIG. 9 is a flow diagram illustrating a method for setting a floating gate using the differential dual floating gate circuit.

FIG. 9 is a flow diagram illustrating a method 90 for setting a floating gate that may be implemented during a set mode, for instance, by circuits 30 and 40 of FIG. 4B. FIGS.

10A–12D illustrate voltage waveforms for Vout, Vp1, Vefb (circuit 40), Vfgr and Vfg1, for the specific implementation of method 90 discussed below relative to those figures. Each of the set of four waveforms shown in FIGS. 10A–12D are the same, only the voltage axes of some of these waveforms are modified to illustrate specific details. Preferably, Vfg1 is set to 4 volts, such that Vfg1 =Vfgr=4V at the conclusion of the set mode. However, Vfg1 may be set to any voltage in order to set Vfgr during the set mode. In the following example, Vfg1 is set to 4V during the set mode. In the circuit implementation illustrated in FIGS. 10A–12D: Vin=4.00V, Vcc=5V, HV+ is about 22V, IpØ, I2 and I2r are each about 6 nA, Ipr is about 12 nA, ItØ and Itr are each about 5 nA; and IgØ and Igr are each about 20 nA.

Figure 12A:
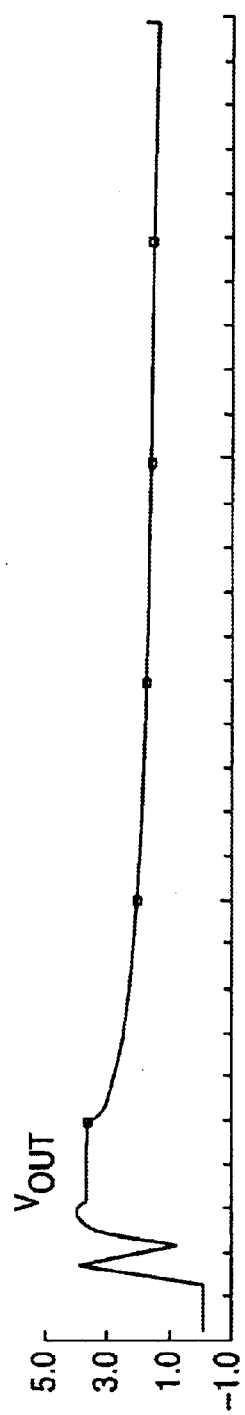
FIGS. 12A–12D illustrate various voltage waveforms vs. time for a specific implementation of the method of FIG. 9.
Figure 12B:
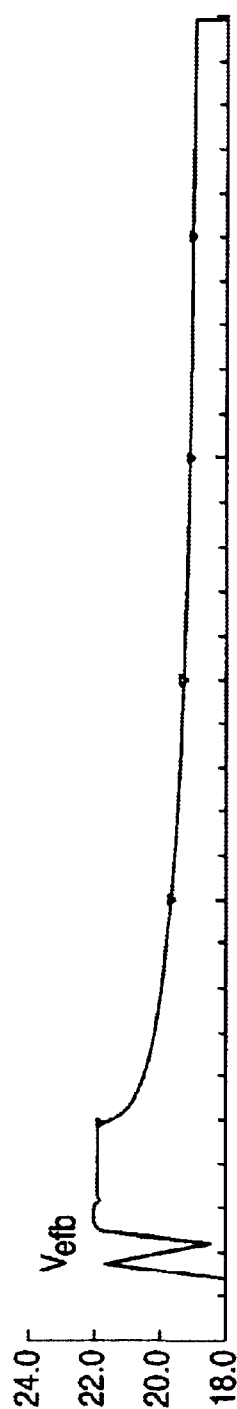
Figure 12C:
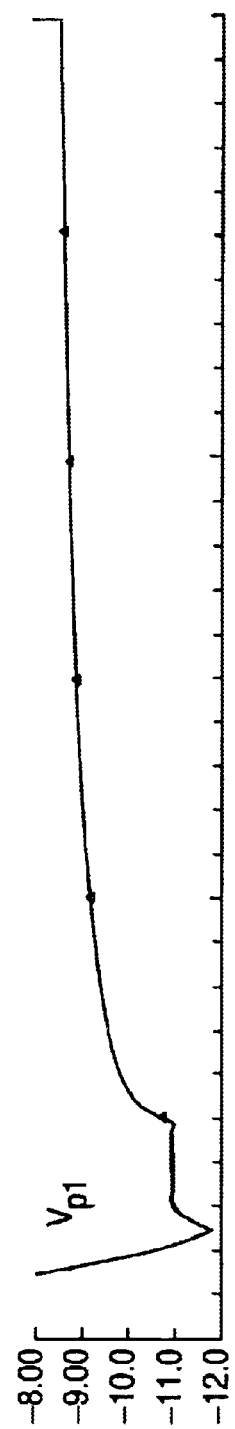
Figure 12D:
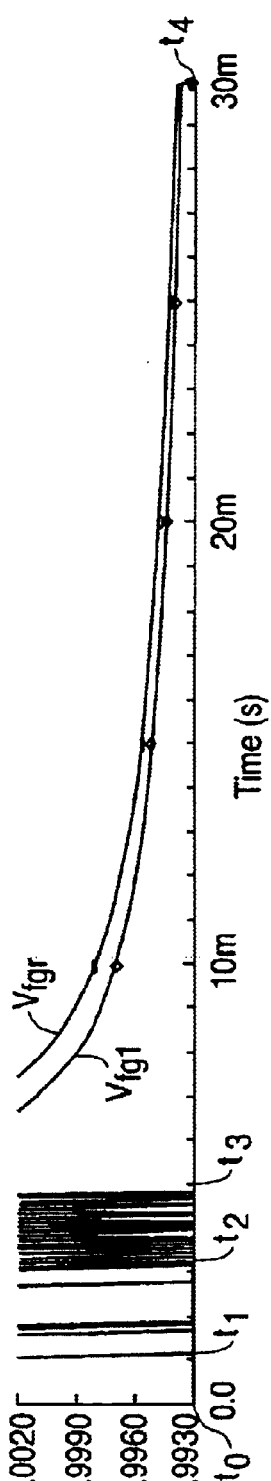

At step 91, circuits 30 and 40 are powered up at the beginning of the set mode, which is illustrated in FIGS. 6A–8D and FIGS. 10A–12D as time $t_0$. Circuit 30 at some point thereafter receives an input set voltage, e.g., VsetØ, and the Vx signal from circuit 30 is received at node 27 into the gate of transistor T15 in circuit 40. In addition Vcc is set to +5V, HV+ is ramped up to a high positive voltage of about +22V, which turns on current sources 12 and 12r. Finally, charge pumps IpØ and Ipr are turned on to enable these current sources to begin generating their corresponding currents. Thereafter, according to the preferred implementation of the remaining steps 92–96 of method 90, circuit 40 can set Vfgr to within about 0.5 mV of Vfg1 in about 30 mSec, as illustrated in FIGS. 10D, 11D, and 12D.

At step 92, circuit 40 causes tunnel devices Ter, Tpr, Te1 and Tp1 to operate in a dual conduction mode under the control of the voltage differential between the corresponding floating gate erase and program electrodes for modifying the charge level on floating gates fgr and fg1. Dual conduction occurs when tunnel current flows through these four tunnel devices. Tunnel current flows through both Ter and Tpr when the voltage differential (Vefb–Vp1) is at least two tunnel voltages or approximately 22V as discussed earlier, and tunnel current flows through Te1 and Tp1 when the voltage differential (Vx–Vp1) is at least two tunnel voltages.

Preferably, circuit 40 causes dual conduction in the following manner. Current sources I2 and I2r are turned on and start to pull up Vx (node 12) and Vefb (node 25) respectively. For example, Vefb ramps up to about 18 volts in less than 0.5 mSec. The negative current sources IpØ and Ipr are turned on and pull Vp (node 3) and Vp1 (node 16) negative. Respectively, in this instance, charge pump IpØ gradually ramps Vp down to about –11V voltage in about 2 mSec, and charge pump Ipr gradually ramps Vp1 down to about –11V voltage in about 2 mSec. Current source IpØ controls the tunnel current that flows through tunneling devices TpØ and TeØ in circuit 30, and current source Ipr controls the tunnel current that flows through tunneling devices Ter, Tpr, Te1 and Tp1 in circuit 40.

Circuit 30 produces a Vx signal controlled by feedback from circuit 320 as described earlier. Vx (node 27) turns on transistor T15, which pulls up Ve1 (node 28) to one Vt below Vefb. When Vp1 ramps down to the point where the difference between Vp1 and Ve1 is 2 tunnel voltages, tunnel current flows through tunneling devices Te1 and Tp1. Once tunnel current is flowing in Te1 and Tp1, the voltage on floating gate fg1 (node 14) is controlled directly by Vx and to first order tracks the voltage on floating gate fgØ in circuit 30 for the rest of the set mode.

Circuit 40 produces a Vefb signal controlled by feedback from circuit 430 in a manner analogous to circuit 30. Vefb (node 25) turns on transistor T13, which pulls up Ver (node 17) to one Vt below Vefb. When Vp1 (node 16) ramps down to the point where the difference between Vp1 and Ver is 2 tunnel voltages, tunnel current flows through tunneling devices Ter and Tpr, and the voltage on fgr (node 15) is controlled directly by Vefb. I2r continues to pull up Vefb until Vefb reaches Vout+1TV+1Vt, where 1TV is the tunnel voltage across tunnel device TF1 and 1Vt is the threshold voltage of transistor T14. When at least one tunnel voltage exists across TF1, tunnel current flows through TF1, and TF1 and transistor T14 act as level shift devices such that Vefb is controlled directly by Vout (node 19). At step 93, circuit 40 compares Vfgr with Vfg1 and generates an output voltage Vout that is a function of the difference between Vfgr and Vfg1. Circuit 40 then, at step 95, causes the voltage differential between Vefb and Vp1 to be modified as a function of Vout, and circuit 40 repeats steps 92 through 95 until circuit 40 settles to a steady state condition, at step 94 where Vfgr is approximately equal to Vfg1. At this point circuit 40 is powered down, at step 96. As a result of method 90, floating gates fgr and fg1 are each set to a charge level that will remain essentially the same over time.

The voltage waveforms of FIGS. 10A–12D illustrate how circuit 40 functions during steps 92 through 95. Dual conduction of tunnel devices Te1 and Tp1 occurs after about 0.5 mSec, as best seen in FIGS. 10A–10D. Prior to this time, Vfg1 is zero volts. However, once tunnel current is flowing through tunnel devices Te1 and Tp1, Vfg1 is controlled by and oscillates with Vx from circuit 30, and Vfg1 tracks VfgØ. Dual conduction of tunnel devices Ter and Tpr, on the other hand, occurs slightly later at about 1.5 mSec, which is illustrated as to in FIGS. 10A–12D. Prior to time $t_1$ Vout= ØV, Vefb is pulled-up by I2r and is ramping toward about 18V, and Vfgr is not controlled by Vefb. Once tunnel current is flowing through tunnel devices Ter, Tpr, and TF1 at time $t_1$: circuit 430 senses that Vfgr is not equal to Vfg1; Vout is a function of the difference between Vfgr and Vfg1; Vefb follows Vout; and Vfgr follows Vefb. For about the next 2.0 mSec which is illustrated as time $t_1$ to time $t_2$ in FIGS. 11A–12D, Vfgr oscillates as Vefb moves up and down as a function of the negative feedback loop. Thereafter, the negative feedback loop causes the differential and gain stages 432 and 434, respectively, to settle to a steady state condition, where circuit 430 ceases to oscillate except for about 30 mV of noise coupled to circuit 430 from the charge pump Ipr as best shown in FIGS. 11A–12D beginning at time $t_2$.

Beginning at time $t_i$, current source Igr in the gain stage 434 produces a current that is much larger than that generated by current source I2r . Therefore, the gain stage 434 is able to control Vout by sinking all the current from current source I2r that flows through T14 and TF1 to Vout. In addition, the compensation capacitor C3 in the gain stage 434 is made large enough to assure that the feedback loop is stable and settles in less than about 1 mSec. The level shift in Vefb caused by the Vt across transistor T14 approximately matches the voltage drop in T13. The level shift in Vefb caused by the tunnel voltage across tunnel device TF1 approximately matches the voltage drop across tunnel device Ter, so that when the differential and gain stages settle, Vfgr, Vfg1 and Vout are about the same. This can be seen in FIGS. 12A–12D where Vout settles to about 3.7V beginning at time $t_2$, reflecting about 30 mV of noise coupled to floating gates fgr and fg1 from current source Ipr.

Referring again to FIG. 9, once circuit 40 settles at step 94 such that Vfgr is approximately equal to Vfg1, circuit 40 is powered down at step 96. Powering down circuit 40 ramps down the voltages at the erase and programming electrodes toward ground, as seen beginning at time $t_3$ in FIGS. 10A–12D. Step 96 may be performed by simply concurrently shutting off all of the current and voltage sources in circuits 30 and 40 at time $t_3$. However, this may significantly impact Vfgr once Vefb and Vp1 have ramped back to ØV. As explained above, noise from charge pump Ipr limits the accuracy of setting Vfgr equal to Vfg1 when the negative charge pump that generates Vp1 is ON. This means Vfgr may not be equal to Vfg1 at the beginning of the ramping of Vefb and Vp1 to ground. If Vfgr is not equal to Vfg1 when this ramp down begins, then Vfgr will not equal Vfg1 after Vp1 and Vefb reach ØV. Moreover, during the ramp down, the current that continues to flow through tunnel devices Te1 and Tp1 and through Ter and Tpr is typically not the same. This further affects the final charge level on floating gates fgr and fg1.

To overcome this limitation and thereby maintain the same charge level on floating gates fgr and fg1 during the ramping of Vefb and Vp1 to ground, the current in the erase and program tunnel devices must be the same during this time. In order to maintain the same current in these tunnel devices, the voltage across each of the tunnel devices must be the same, which means Vefb and Vx must ramp down to ØV at the same rate as Vp1 ramps up to ØV. Also the tunnel device characteristics must be reasonably well matched.

Accordingly circuit 40 should be powered down, at step 96, in the following preferred manner. Once circuits 320 and 430 and the feedback circuits in both circuits 30 and 40 have stabilized for a time and it is clear that further accuracy to setting VfgØ, Vfgr and Vfg1 is limited primarily by the charge pump noise, shown beginning at $t_2$, IpØ and Ipr are shut off at $t_3$ to eliminate the pump noise. However, HV+, and thereby current sources 12 and I2r, are left on such that the feedback circuit in circuit 30 is still active and continues to control Vx, and the feedback circuit in circuit 40 is still active and continues to control Vefb. At the point when the negative charge pumps are shut off, tunnel current continues to flow through tunnel devices TeØ and TpØ as capacitor CpØ discharges, which pulls up Vp back towards ØV. This tunnel current and the capacitance due to CpØ determine the ramp rate on Vp. Similarly, tunnel current continues to flow through tunnel devices Ter, Te1, Tpr and Tp1 as capacitor Cpr discharges, which pulls up Vp1 back towards ØV. This tunnel current and the capacitance due to Cpr determine the ramp rate on Vp1.

Feedback in circuit 30 drives Vx such that VfgØ is set as described previously. To first order, Vfg1 tracks VfgØ, assuming Vp and Vp1 track each other reasonably closely. Similarly to what occurs in circuit 30, in circuit 40 as Vp1 ramps up, the voltage on floating gate fgr is capacitively coupled upwards. Circuit 430 senses Vfg1 moving upwards and ramps Vefb down toward ØV through the feedback circuit. As Vefb ramps down and Vp1 ramps up toward ØV, the tunnel current in tunnel devices Ter and Tpr decrease rapidly due to the steep slope of their Fowler-Nordheim tunnel device characteristics. Since feedback response time depends directly on the current in the erase tunnel device, the feedback circuit response slows down as Vefb ramps down toward ground. As the tunnel current decreases, both the ramp rate and feedback response times slow down and Vfgr gradually moves closer to Vfg1.

For instance, FIG. 12D shows that Vfgr has converged to within about 0.5 mV of Vfg1 for a set mode time of 30 mSec, and Vfgr may be set even more accurately with respect to Vfg1 by allowing a ramp down time of greater than 30 mV. After Vfgr is allowed to converge on Vfg1 for an amount of time determined by the level of accuracy desired, the HV+ voltage supply, and thereby the I2r current source, can be shut off, for instance at time $t_4$, without affecting the charge on floating gates fgr and fg1. Moreover, Vcc may be shut off.

It is important that the response of the feedback circuit is slow enough to assure Vfgr is always slightly above Vfg1 so circuit 430 and the feedback circuit continue to ramp Vefb down. If Vfgr goes below Vfg1 and the feedback switches the direction Vefb is ramping, the feedback system will start to oscillate very slowly and Vfgr will diverge from Vfg1 instead of converge towards Vfg1. After Vefb and Vp1 have ramped a few volts toward ground and Vfgr is very close to Vfg1, Vefb and Vp1 can be ramped to ØV quickly, as illustrated at time t4 in FIGS. 10B–10D, by shutting off HV+, because the current in tunnel devices Ter and Tpr is so low it no longer affects the charge on the floating gate fgr. Capacitor Cpr must be carefully set to assure that as Vp1 rises toward ground, the feedback path through the differential stage 432, gain stage 434, TF1 level shift and Ter devices to floating gate fgr is able to ramp down Vefb and move Vfgr closer and closer to Vfg1. If capacitor Cpr is too small, Vp1 rises very quickly, the delay through the feedback path causes Vefb to ramp down too slowly, and Vfgr will rise above Vfg1 instead of converging towards Vfg1. If Cpr is too large, the response of the feedback path is too fast and Vefb is ramped down too much, such that Vfgr may undershoot which causes the circuit to oscillate slowly. If circuit 430 is allowed to oscillate, Vfgr will tend to diverge instead of converge towards Vfg1. Accordingly, Cpr is designed such that the feedback response time is slightly slower than the discharge rate of Cpr. Preferably Cpr should be set at about 2.4 pf.

At the end of the set mode, at time $t_4$, floating gates fgr and fg1 will continue to indefinitely store the charge level programmed on them during the set mode, subject to possible charge loss, e.g., due to detrapping of electrons or dielectric relaxation over time, without any external power being supplied to circuit 40. In addition, although in the example illustrated above Vfgr was set to be approximately equal to Vfg1, those of ordinary skill in the art will realize that in another embodiment of the present invention, circuit 40 can be configured such that Vfgr is set a voltage that is some other function of Vfg1.

As stated above, once floating gate fgØ is set during the set mode, circuit 30 may be configured during a read mode as a voltage reference circuit or as a comparator circuit with a built-in voltage reference. Likewise, once floating gates fg1 and fgr are set during the set mode, circuit 40 may be configured during a read mode as a voltage reference circuit or a comparator circuit with a built-in voltage reference. When circuit 40 is configured as a voltage reference, it provides a more accurate reference voltage at node 19 over that provided by circuit 30 when circuit 30 is configured as a voltage reference. This is because when high voltages are ramped down in circuit 40, any offsets coupled through the tunnel devices to the corresponding floating gates fgr and fg1 are common mode and do not change the voltage difference between the two floating gates and thus does not change the reference voltage at node 19.

The apparatus for feedback during a set mode using a tunnel device described in the text above was chosen as being illustrative of the best mode of the present invention. All embodiments of the present invention described above are illustrative of the principles of the invention and are not intended to limit the invention to the particular embodiments described. Accordingly, while the preferred embodiment of the invention has been illustrated and described, it will be appreciated that various changes can be made therein without departing from the spirit and scope of the invention as claimed.

What is claimed is:

1. Apparatus for using feedback to set a floating gate to a desired voltage during a set mode, said apparatus comprising:
   a) a floating gate for storing charge thereon;
   b) a first tunnel device formed between said floating gate and a first tunnel electrode, said first tunnel electrode biased by a first voltage;
   c) a second tunnel device formed between said floating gate and a second tunnel electrode, said second tunnel electrode biased by a second voltage, wherein the voltage differential between said first and second voltages for causing said first and second tunnel devices to operate in dual conduction during said set mode;
   d) a first circuit coupled to said floating gate, said first circuit comprising a differential stage for comparing the voltage on said floating gate to a third voltage, and a gain stage for generating an output voltage at an output terminal that is a function of the difference between the voltage on said floating gate and said third voltage; and
   e) a feedback circuit coupled between said output terminal and said floating gate comprising said first tunnel device and a third tunnel device, said feedback circuit for causing the voltage on said floating gate to be modified as a function said output voltage until said floating gate voltage, said third voltage and said output voltage are approximately equal.

2. The apparatus of claim 1, wherein said first tunnel device is an erase tunnel device and wherein said third tunnel device is reasonably well matched to said first tunnel device.

3. The apparatus of claim 1, wherein said third voltage is an input set voltage.

4. The apparatus of claim 3, wherein said differential stage comprises a first, second, third and fourth transistor, each said transistor having a gate and a first and second terminal, wherein said floating gate is the gate of said first transistor, the gate of said second transistor is coupled to said input set voltage, the first terminals of said first and second transistors are coupled together, the second terminals of said first and third transistors are coupled together and are further coupled to the gates of said third and fourth transistors, the second terminals of said second and fourth transistors are coupled together, and the first terminals of said third and fourth transistors are coupled together; and wherein said gain stage comprises a fifth transistor, having a gate and a first and second terminal, a current source, and a compensation capacitor, wherein the gate of said fifth transistor is coupled to the second terminals of said second and fourth transistors, the first terminal of said fifth transistor is coupled to the first terminals of said third and fourth transistors, the second terminal of said fifth transistor is coupled to said current source and to said output terminal, and said compensation capacitor is coupled between the gate and the second terminal of said fifth transistor.

5. The apparatus of claim 1, wherein said third voltage is the voltage on a second floating gate coupled to said first circuit.

6. The apparatus of claim 5, wherein said differential stage comprises a first, second, third and fourth transistor, each said transistor having a gate and a first and second terminal, wherein said first floating gate is the gate of said first transistor, said second floating gate is the gate of said second transistor, the first terminals of said first and second transistors are coupled together, the second terminals of said first and third transistors are coupled together and are further coupled to the gates of said third and fourth transistors, the second terminals of said second and fourth transistors are coupled together, and the first terminals of said third and fourth transistors are coupled together; and wherein said gain stage comprises a fifth transistor, having a gate and a first and second terminal, a current source, and a compensation capacitor, wherein the gate of said fifth transistor is coupled to the second terminals of said second and fourth transistors, the first terminal of said fifth transistor is coupled to the first terminals of said third and fourth transistors, the second terminal of said fifth transistor is coupled to said current source and to said output terminal, and said compensation capacitor is coupled between the gate and the second terminal of said fifth transistor.

7. Apparatus for using feedback to set a floating gate to a desired voltage during a set mode, said apparatus comprising:
   a) a floating gate for storing charge thereon;
   b) a first tunnel device formed between said floating gate and a first tunnel electrode, said first tunnel electrode biased by a first voltage;
   c) a second tunnel device formed between said floating gate and a second tunnel electrode, said second tunnel electrode biased by a second voltage, wherein the voltage differential between said first and second voltages for causing said first and second tunnel devices to operate in dual conduction during said set mode;
   d) a first circuit coupled to said floating gate, said first circuit comprising a differential stage for comparing the voltage on said floating gate to an input set voltage, and a gain stage for generating an output voltage at an output terminal that is a function of the difference between the voltage on said floating gate and said input set voltage, wherein:
      said differential stage comprises a first, second, third and fourth transistor, each said transistor having a gate and a first and second terminal, wherein said floating gate is the gate of said first transistor, the gate of said second transistor is coupled to said input set voltage, the first terminals of said first and second transistors are coupled together, the second terminals of said first and third transistors are coupled together and are further coupled to the gates of said third and fourth transistors, the second terminals of said second and fourth transistors are coupled together, and the first terminals of said third and fourth transistors are coupled together; and
      said gain stage comprises a fifth transistor, having a gate and a first and second terminal, a current source, and a compensation capacitor, wherein the gate of said fifth transistor is coupled to the second terminals of said second and fourth transistors, the first terminal of said fifth transistor is coupled to the first terminals of said third and fourth transistors, the second terminal of said fifth transistor is coupled to said current source and to said output terminal, and said compensation capacitor is coupled between the gate and the second terminal of said fifth transistor; and
   e) a feedback circuit coupled between said output terminal and said floating gate comprising said first tunnel device and a third tunnel device, said feedback circuit for causing the voltage on said floating gate to be modified as a function said output voltage until said floating gate voltage, said input set voltage and said output voltage are approximately equal.

8. Apparatus for using feedback to set a floating gate to a desired voltage during a set mode, said apparatus comprising:

a) a first floating gate for storing charge thereon;

b) a first tunnel device formed between said first floating gate and a first tunnel electrode, said first tunnel electrode biased by a first voltage;

c) a second tunnel device formed between said first floating gate and a second tunnel electrode, said second tunnel electrode biased by a second voltage, wherein the voltage differential between said first and second voltages for causing said first and second tunnel devices to operate in dual conduction during said set mode;

d) a second floating gate for storing charge thereon;

e) a third tunnel device formed between said second floating gate and a third tunnel electrode, said third tunnel electrode biased by a third voltage;

f) a fourth tunnel device formed between said second floating gate and a fourth tunnel electrode, said fourth tunnel electrode biased by said second voltage, wherein the voltage differential between said third and second voltages for causing said third and fourth tunnel devices to operate in dual conduction during said set mode;

g) a first circuit coupled between said first and second floating gates, said first circuit comprising a differential stage for comparing the voltage on said first floating gate to the voltage on said second floating gate, and a gain stage for generating an output voltage at an output terminal that is a function of the difference between the voltages on said first and second floating gates, wherein:

said differential stage comprises a first, second, third and fourth transistor, each said transistor having a gate and a first and second terminal, wherein said first floating gate is the gate of said first transistor, said second floating gate is the gate of said second transistor, the first terminals of said first and second transistors arc coupled together, the second terminals of said first and third transistors are coupled together and arc further coupled to the gates of said third and fourth transistors, the second terminals of said second and fourth transistors are coupled together, and the first terminals of said third and fourth transistors are coupled together; and said gain stage comprises a fifth transistor, having a gate and a first and second terminal, a current source, and a compensation capacitor, wherein the gate of said fifth transistor is coupled to the second terminals of said second and fourth transistors, the first terminal of said fifth transistor is coupled to the first terminals of said third and fourth transistors, the second terminal of said fifth transistor is coupled to said current source and to said output terminal, and said compensation capacitor is coupled between the gate and the second terminal of said fifth transistor; and h) a feedback circuit coupled between said output terminal and said first floating gate comprising said first tunnel device and a fifth tunnel device, said feedback circuit for causing the voltage on said first floating gate to be modified as a function said output voltage unit said first floating gate voltage, said second floating gate voltage and said output voltage are approximately equal.

* * * * *